(12) United States Patent
Zhang

(10) Patent No.: US 11,885,955 B2
(45) Date of Patent: Jan. 30, 2024

(54) CIRCUIT BOARD, CIRCUIT BOARD JOINTED PANEL, PERISCOPE CAMERA MODULE, AND APPLICATION THEREOF

(71) Applicant: NINGBO SUNNY OPOTECH CO., LTD., Zhejiang (CN)

(72) Inventor: Yinbo Zhang, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 357 days.

(21) Appl. No.: 17/295,652

(22) PCT Filed: Oct. 25, 2019

(86) PCT No.: PCT/CN2019/113353
§ 371 (c)(1),
(2) Date: May 20, 2021

(87) PCT Pub. No.: WO2020/103644
PCT Pub. Date: May 28, 2020

(65) Prior Publication Data
US 2022/0011565 A1     Jan. 13, 2022

(30) Foreign Application Priority Data

Nov. 22, 2018  (CN) .......................... 201811397359.1
Nov. 22, 2018  (CN) .......................... 201821934729.6

(51) Int. Cl.
G02B 23/24     (2006.01)
G06F 1/16      (2006.01)
H05K 1/14      (2006.01)

(52) U.S. Cl.
CPC ....... *G02B 23/2484* (2013.01); *G06F 1/1686* (2013.01); *H05K 1/147* (2013.01); *H05K 2201/10151* (2013.01)

(58) Field of Classification Search
CPC ... G02B 23/2484; G02B 23/08; G06F 1/1686; H05K 1/147; H05K 2201/10151;
(Continued)

(56) References Cited

U.S. PATENT DOCUMENTS 6,160,967 A * 12/2000 Mizobuchi ............. H05K 1/189
                                                361/818
9,716,781 B2 * 7/2017 Lee ........................ H01H 13/02
(Continued)

FOREIGN PATENT DOCUMENTS

CN     105261083      1/2016
CN     107786781      3/2018
(Continued)

OTHER PUBLICATIONS

International Search Report dated Jan. 23, 2020 in International (PCT) Application No. PCT/CN2019/113353.

*Primary Examiner* — Chiawei Chen
(74) *Attorney, Agent, or Firm* — WENDEROTH, LIND & PONACK, L.L.P.

(57) ABSTRACT

A circuit board includes a flexible circuit board layer, a rigid circuit board layer, a chip connection portion, and a bending portion. The chip connection portion includes at least part of the flexible circuit board layer and at least part of the rigid circuit board layer overlapping the flexible circuit board layer. The bending portion includes at least part of the flexible circuit board layer and at least part of the rigid circuit board layer overlapping the flexible circuit board layer. The bending portion is connected to the chip connection portion in an invertible manner, after the bending portion is inverted to the rear side of the chip connection portion, a part of the flexible circuit board layer of the bending portion and a part of the flexible circuit board layer of the chip connection portion are arranged face-to-face.

20 Claims, 11 Drawing Sheets

(58) Field of Classification Search
CPC .............. H05K 1/0277; H05K 1/181; H05K 2201/10121; H05K 3/4691; H04N 23/57; H04N 23/50; H04M 1/0264; H04M 1/0277

See application file for complete search history.

(56) References Cited

U.S. PATENT DOCUMENTS

| | | | | |
|---|---|---|---|---|
| 10,765,014 | B2* | 9/2020 | Ryou | .................... H05K 1/0281 |
| 2001/0055073 | A1* | 12/2001 | Shinomiya | ............. H04N 23/55 348/340 |
| 2007/0019950 | A1* | 1/2007 | Tanaka | ................. G02B 13/009 396/462 |
| 2015/0319275 | A1* | 11/2015 | Lee | ........................ H01R 12/79 455/575.1 |
| 2017/0104906 | A1* | 4/2017 | Tang | ....................... H04N 23/55 |
| 2019/0150299 | A1* | 5/2019 | Naohara | .............. H05K 1/0393 361/749 |
| 2019/0269022 | A1* | 8/2019 | Ryou | .................... H05K 1/148 |
| 2021/0014391 | A1* | 1/2021 | Uemura | ................. H04N 23/57 |
| 2023/0224394 | A1* | 7/2023 | Yan | .................... H04M 1/0262 361/749 |

FOREIGN PATENT DOCUMENTS

| | | |
|---|---|---|
| CN | 108055440 | 5/2018 |
| EP | 3 331 333 | 6/2018 |
| JP | 2004-140228 | 5/2004 |
| JP | 2007-33699 | 2/2007 |
| KR | 10-2017-0014504 | 2/2017 |
| WO | 2015/196489 | 12/2015 |
| WO | 2018/035943 | 3/2018 |

\* cited by examiner

CIRCUIT BOARD, CIRCUIT BOARD JOINTED PANEL, PERISCOPE CAMERA MODULE, AND APPLICATION THEREOF

TECHNICAL FIELD

The invention relates to a periscope camera module, and in particular to a circuit board, a circuit board jointed panel, a periscope camera module, and application thereof.

BACKGROUND TECHNIQUE

The periscope camera module turns the light through a light steering mechanism, so as to reduce the height of the entire camera module, and at the same time, the entire periscope camera module can be designed with a larger effective focal length, thereby satisfying consumers' requirements for higher zoom magnification.

However, with the current pursuit of thinner and lighter electronic equipment, the installation space that can be provided for the periscope camera modules in the electronic equipment is very limited. Especially for periscope camera modules compared to ordinary camera modules, the height of the periscope camera module is generally larger than that of the ordinary camera module, so that it protrudes more obviously from the surface of the electronic device when it is installed on the electronic device. Therefore, how to reduce the size of the periscope camera module while ensuring the quality of its work is an issue that requires continuous attention.

The size of a circuit board of the periscope camera module has a greater influence on the overall size of the periscope camera module, especially the height, so that the entire periscope camera module occupies too much space in the electronic device. The structure and installation method of the circuit board itself also limit the reduction of its size.

Particularly, referring to FIG. 1 and FIG. 2, the circuit board 10P of the current periscope camera module 1000P is a type of T-shaped mechanism, which mainly includes a first bending portion 11P and a second bending portion 12P, a third bending portion 13P, and a connection portion 14P, wherein the first bending portion 11P is used for mounting the photosensitive chip 40P, the second bending portion 12P is used for connecting a motor, and the third bending portion 13P is used for connecting an electronic device, and the connection portion 14P is simultaneously connected to the first bending portion 11P, the second bending portion 12P, and the third bending portion 13P. The first bending portion 11P, the second bending portion 12P, and the third bending portion 13P may all be bent relative to the connection portion 14P, and both of the first bending portion 11P and the connection portion 14P are respectively composed of three parts: a rigid part, a flexible part, and another rigid part; wherein the flexible part is located between the two rigid parts, and the connection portion 14P is respectively connected to the first bending portion 11P, the second bending portion 12P, and the third bending portion 13P by another flexible part. Since the entire circuit board 10P is manufactured by a lamination process, it is necessary to evenly arrange the rigid parts on the two opposite sides of the flexible part in consideration of uniform stress.

When the circuit board 10P is bent for assembly, the photosensitive chip 40P located at the first bending portion 11P is mounted at a corresponding position, so other parts of the circuit board 10P need to be bent correspondingly along the flexible part between the connection portion 14P and the first bending portion 11P, and then the second bending portion 12P is bent along the flexible part between the connection portion 14P and the second bending portion 12P. Finally, in order to reduce the size of the circuit board 10P in the height direction, it is necessary to bend the flexible part between the connection portion 14P and the third bending portion 13P, so as to bend the third bending portion 13P. During each bending process, on one hand, it is necessary to avoid the rigid part, and on the other hand, in consideration of avoiding the tearing of the entire structure, a larger part of the bent flexible part is still exposed, and this is not advantageous for the reduction of size of the entire periscope camera module 1000P.

CONTENTS OF THE INVENTION

An object of the present invention is to provide a circuit board, a circuit board jointed panel, a periscope camera module, and application thereof, wherein size of the periscope camera module can be reduced, especially size in height.

Another object of the present invention is to provide a circuit board, a circuit board jointed panel, a periscope camera module and applications thereof, wherein the size of the circuit board of the periscope camera module can be reduced.

Another object of the present invention is to provide a circuit board, a circuit board jointed panel, a periscope camera module, and application thereof, wherein size in area of the circuit board can be reduced.

Another object of the present invention is to provide a circuit board, a circuit board jointed panel, a periscope camera module, and application thereof, wherein size in thickness of the circuit board can be reduced.

Another object of the present invention is to provide a circuit board, a circuit board jointed panel, a periscope camera module, and application thereof, wherein when the circuit board is manufactured in a manner of jointed panel, the circuit board jointed panel can accommodate more circuit boards.

Another object of the present invention is to provide a circuit board, a circuit board jointed panel, a periscope camera module, and application thereof, wherein production efficiency of the circuit board jointed panel can be improved.

Another object of the present invention is to provide a circuit board, a circuit board jointed panel, a periscope camera module, and application thereof, wherein overall size of the circuit board can be reduced after being bent.

Another object of the present invention is to provide a circuit board, a circuit board jointed panel, a periscope camera module, and application thereof, wherein overall size in height of the circuit board can be reduced after being bent.

Another object of the present invention is to provide a circuit board, a circuit board jointed panel, a periscope camera module, and application thereof, wherein assembly accuracy for assembling the circuit board in an assembling process can be reduced, so as to reduce assembly difficulty.

Another object of the present invention is to provide a circuit board, a circuit board jointed panel, a periscope camera module, and application thereof, wherein the number of times of bending of the circuit board in the assembling process can be reduced, so as to reduce manufacturing steps.

According to one aspect of the present invention, the present invention provides a circuit board including:
 a rigid circuit board layer, wherein the rigid circuit board layer includes a first part of rigid circuit board layer;

a flexible circuit board layer, wherein the rigid circuit board layer is arranged on a front side of the flexible circuit board layer, and the flexible circuit board layer includes a first part of flexible circuit board layer and a second part of flexible circuit board layer, and the first part of flexible circuit board layer extends to the second part of flexible circuit board layer;

a chip connection portion, wherein the chip connection portion includes the first part of rigid circuit board layer and a part of the first part of flexible circuit board layer overlapping the first part of rigid circuit board layer; and a bending portion, wherein the bending portion includes at least part of the second part of flexible circuit board layer, and the bending portion is connected to the chip connection portion in an invertible manner.

According to an embodiment of the present invention, the rigid circuit board layer further includes a second part of rigid circuit board layer, wherein the bending portion includes the second part of rigid circuit board layer and a part of the second part of flexible circuit board layer overlapping the second part of rigid circuit board layer.

According to an embodiment of the present invention, a part of the first part of flexible circuit board layer of the chip connection portion located close to one end of the bending portion is detachably connected to the first part of rigid circuit board.

According to an embodiment of the present invention, a part of the first part of flexible circuit board layer of the chip connection portion located close to one end of the bending portion is detachably connected to the first part of rigid circuit board.

According to an embodiment of the present invention, a part of the second part of flexible circuit board layer of the bending portion located close to one end of the chip connection portion is detachably connected to the second part of rigid circuit board layer.

According to an embodiment of the present invention, a part of the first part of flexible circuit board layer of the chip connection portion located close to one end of the bending portion is detachably connected to the first part of rigid circuit board.

According to an embodiment of the present invention, after the bending portion is inverted to a rear side of the chip connection portion, the bent part of the flexible circuit board layer located between the bending portion and the chip connection portion does not protrude from the rigid circuit board layer.

According to an embodiment of the present invention, after the bending portion is inverted to a rear side of the chip connection portion, the bent part of the flexible circuit board layer located between the bending portion and the chip connection portion does not protrude from the rigid circuit board layer.

According to an embodiment of the present invention, the flexible circuit board layer further includes a third part of flexible circuit board layer, and the third part of flexible circuit board layer is connected to the first part of flexible circuit board layer through the second part of flexible circuit board layer, and the circuit board further includes a lenses assembly connection portion, and the rigid circuit board layer further includes a third part of rigid circuit board layer, wherein the lenses assembly connection portion includes the third part of rigid circuit board layer and a part of the third part of flexible circuit board layer overlapping the third part of rigid circuit board layer, and the chip connection portion, the bending portion and the lenses assembly connection portion are located on a same straight line, and the lenses assembly connection portion is connected to the bending portion in an invertible manner.

According to an embodiment of the present invention, the flexible circuit board layer further includes a third part of flexible circuit board layer, and the first part of flexible circuit board layer has a first side and a second side, and the first side and the second side are adjacent, and the second part of flexible circuit board layer and the third part of flexible circuit board layer respectively extend to the first side and the second side, wherein the circuit board further includes a lenses assembly connection portion, and the rigid circuit board layer further includes a third part of rigid circuit board layer, wherein the lenses assembly connection portion includes the third part of rigid circuit board layer and a part of the third part of flexible circuit board layer overlapping the third part of rigid circuit board layer, and the bending portion and the lenses assembly connection portion are respectively located on two adjacent sides of the chip connection portion, and the lenses assembly connection portion is connected to the chip connection portion in an invertible manner.

According to an embodiment of the present invention, the flexible circuit board layer further includes a fourth part of flexible circuit board layer, and the circuit board further includes a connecting strap connection portion, wherein the connecting strap connection portion is adapted to connect a connecting strap, and the connecting strap connection portion includes at least part of the fourth part of flexible circuit board layer, and the fourth part of flexible circuit board layer extends to the chip connection portion, and an extending direction of the fourth part of flexible circuit board layer is perpendicular to an extending direction from the chip connection portion to the bending portion, and the connecting strap connection portion is connected to the chip connection portion in an invertible manner.

According to an embodiment of the present invention, the flexible circuit board layer further includes a fourth part of flexible circuit board layer, and the circuit board further includes a connecting strap connection portion, wherein the connecting strap connection portion is adapted to connect a connecting strap, and the connecting strap connection portion includes at least part of the fourth part of flexible circuit board layer, and the fourth part of flexible circuit board layer extends to the chip connection portion, and an extending direction of the fourth part of flexible circuit board layer is perpendicular to an extending direction from the chip connection portion to the bending portion, and the connecting strap connection portion is connected to the chip connection portion in an invertible manner.

According to an embodiment of the present invention, the flexible circuit board layer further includes a fourth part of flexible circuit board layer, and the circuit board further includes a connecting strap connection portion, wherein the connecting strap connection portion is adapted to connect a connecting strap, and the connecting strap connection portion includes at least part of the fourth part of flexible circuit board layer, and the fourth part of flexible circuit board layer extends to the bending portion, and an extending direction of the fourth part of flexible circuit board layer is perpendicular to an extending direction from the chip connection portion to the bending portion.

According to an embodiment of the present invention, the flexible circuit board layer further includes a fourth part of flexible circuit board layer, and the circuit board further includes a connecting strap connection portion, wherein the connecting strap connection portion is adapted to connect a connecting strap, and the connecting strap connection portion includes at least part of the fourth part of flexible circuit board layer, and the fourth part of flexible circuit board layer extends to the bending portion, and an extending direction of the fourth part of flexible circuit board layer is perpendicular to an extending direction from the chip connection portion to the bending portion.

According to an embodiment of the present invention, the circuit board further includes a reinforcing member, wherein the reinforcing member is arranged on the bending portion to fix the second part of flexible circuit board layer of the bending portion located at one end away from the chip connection portion on the second part of rigid circuit board layer.

According to another aspect of the present invention, the present invention provides circuit board jointed panel including: a plurality of the circuit boards according to any one of claims 1-15, wherein the circuit board jointed panel includes a flexible circuit board layer and a plurality of rigid circuit board layers, and one of the rigid circuit board layers and corresponding part of the flexible circuit board layer form a single circuit board.

According to another aspect of the present invention, the present invention provides a periscope camera module including:
  a periscope lenses assembly; and
  a photosensitive assembly, wherein the photosensitive assembly includes a lenses holder, a photosensitive chip and a circuit board, and the periscope lenses assembly is held in a photosensitive path of the photosensitive chip through the lenses holder, and the photosensitive chip is conductively connected to the circuit board, wherein the circuit board includes:
  a rigid circuit board layer, wherein the rigid circuit board layer includes a first part of rigid circuit board layer;
  a flexible circuit board layer, wherein the flexible circuit board layer includes a first part of flexible circuit board layer and a second part of flexible circuit board layer;
  a chip connection portion, wherein the chip connection portion includes the first part of rigid circuit board layer and a part of the first part of flexible circuit board layer overlapping the first part of rigid circuit board layer; and
  a bending portion, wherein the bending portion includes at least part of the second part of flexible circuit board layer, wherein the bending portion is connected to the chip connection portion in an invertible manner, and the photosensitive chip connection portion is mounted on a front side of the chip connection portion, and the bending portion is inverted to a rear side of the photosensitive chip connection portion.

According to an embodiment of the present invention, the rigid circuit board layer further includes a second part of rigid circuit board layer, and the bending portion includes the second part of rigid circuit board and a part of the second part of flexible circuit board layer overlapping the second part of rigid circuit board layer.

According to an embodiment of the present invention, a part of the first part of flexible circuit board layer of the chip connection portion located close to one end of the bending portion is detachably connected to the first part of rigid circuit board layer.

According to an embodiment of the present invention, a part of the first part of flexible circuit board layer of the chip connection portion located close to one end of the bending portion is detachably connected to the first part of rigid circuit board layer.

According to an embodiment of the present invention, a part of the second part of flexible circuit board layer of the bending portion located close to one end of the chip connection portion is detachably connected to the second part of rigid circuit board layer.

According to an embodiment of the present invention, a part of the first part of flexible circuit board layer of the chip connection portion located close to one end of the bending portion is detachably connected to the first part of rigid circuit board layer.

According to an embodiment of the present invention, the bent part of the flexible circuit board layer located between the bending portion and the chip connection portion does not protrude from the rigid circuit board layer.

According to an embodiment of the present invention, the bent part of the flexible circuit board layer located between the bending portion and the chip connection portion does not protrude from the rigid circuit board layer.

According to an embodiment of the present invention, the flexible circuit board layer further includes a third part of flexible circuit board layer, and the third part of flexible circuit board layer is connected to the first part of flexible circuit board layer through the second part of flexible circuit board layer, wherein the circuit board further includes a lenses assembly connection portion, and the rigid circuit board layer further includes a third part of rigid circuit board, and the lenses assembly connection portion includes the third part of rigid circuit board layer and a part of the third part of third flexible circuit board layer overlapping the third part of rigid circuit board layer, and the chip connection portion, the bending portion and the lenses assembly connection portion are located on a same straight line, and the lenses assembly connection portion is inverted relative to the chip connection portion and is connected to the periscope lenses assembly.

According to an embodiment of the present invention, the flexible circuit board layer further includes a third part of flexible circuit board layer, and the first part of flexible circuit board layer has a first side and a second side, and the first side and the second side are adjacent, and the second part of flexible circuit board layer and the third part of flexible circuit board layer respectively extend to the first side and the second side, wherein the circuit board further includes a lenses assembly connection portion, and the rigid circuit board layer further includes a third part of rigid circuit board layer, and the lenses assembly connection portion includes the third rigid circuit board layer and a part of the third flexible circuit board layer portion overlapping the third part of rigid circuit board layer, and the bending portion and the lenses assembly connection portion are respectively located on two adjacent sides of the chip connection portion, and the lenses assembly connection portion is inverted relative to the chip connection portion and is connected to the periscope lenses assembly.

According to an embodiment of the present invention, the flexible circuit board layer further includes a fourth part of flexible circuit board layer, and the circuit board further includes a connecting strap connection portion, and the connecting strap connection portion is adapted to connect a connecting strap, and the connecting strap connection portion includes at least part of the fourth part of flexible circuit board layer, and the fourth part of flexible circuit board layer extends to the chip connection portion, and an extending direction of the fourth part of flexible circuit board layer is perpendicular to an extending direction from the chip connection portion to the bending portion, and the connecting strap connection portion is inverted to the rear side of the chip connection portion.

According to an embodiment of the present invention, the flexible circuit board layer further includes a fourth part of flexible circuit board layer, and the circuit board further includes a connecting strap connection portion, and the connecting strap connection portion is adapted to connect a connecting strap, and the connecting strap connection portion includes at least part of the fourth part of flexible circuit board layer, and the fourth part of flexible circuit board layer extends to the chip connection portion, and an extending direction of the fourth part of flexible circuit board layer is perpendicular to an extending direction from the chip connection portion to the bending portion, and the connecting strap connection portion is inverted to the rear side of the chip connection portion.

According to an embodiment of the present invention, the flexible circuit board layer further includes a fourth part of flexible circuit board layer, and the circuit board further includes a connecting strap connection portion, and the connecting strap connection portion is adapted to connect a connecting strap, and the connecting strap connection portion includes at least part of the fourth part of flexible circuit board layer, and the fourth part of flexible circuit board layer extends to the bending portion, and an extending direction of the fourth part of flexible circuit board layer is perpendicular to an extending direction from the chip connection portion to the bending portion, and the connecting strap connection portion is inverted to the rear side of the chip connection portion.

According to an embodiment of the present invention, the flexible circuit board layer further includes a fourth part of flexible circuit board layer, and the circuit board further includes a connecting strap connection portion, and the connecting strap connection portion is adapted to connect a connecting strap, and the connecting strap connection portion includes at least part of the fourth part of flexible circuit board layer, and the fourth part of flexible circuit board layer extends to the bending portion, and an extending direction of the fourth part of flexible circuit board layer is perpendicular to an extending direction from the chip connection portion to the bending portion, wherein the connecting strap connection portion is inverted to the rear side of the chip connection portion.

According to an embodiment of the present invention, the circuit board further includes a reinforcing member, and the reinforcing member is arranged on the bending portion to fix the second part of flexible circuit board layer of the bending portion located at one end away from the chip connection portion on the second part of rigid circuit board layer.

According to another aspect of the present invention, the present invention provides an electronic device including:
an electronic device body; and
the periscope camera module according to any one of claims 17-20, wherein the periscope camera module is arranged on the electronic device body.

According to an embodiment of the present invention, the electronic device further includes a connecting strap, wherein the connecting strap is mounted on the circuit board of the periscope camera module, and the periscope camera module is electrically connected to the electronic device body via the connecting strap.

According to another aspect of the present invention, the present invention provides an installation method of the circuit board above mentioned, which includes the following steps:

mounting a photosensitive chip on a front side of the chip connection portion of the circuit board;
fixing the chip connection portion to a lenses holder of a periscope camera module; and inverting the bending portion of the circuit board to the rear side of the chip connection portion.

According to an embodiment of the present invention, the installation method further includes the following steps:
inverting a lenses assembly connection portion of the circuit board to be connected to a periscope lenses assembly of the periscope camera module, wherein the flexible circuit board layer further includes a third part of flexible circuit board layer, and the first part of flexible circuit board layer has a first side and a second side, and the first side and the second side are adjacent, and the second part of flexible circuit board layer and the third part of flexible circuit board layer respectively extend to the first side and the second side, and the circuit board further includes a lenses assembly connection portion, and the lenses assembly connection portion includes at least part of the third part of flexible circuit board layer.

According to an embodiment of the present invention, the installation method further includes the following steps:
inverting a lenses assembly connection portion of the circuit board to be connected to a periscope lenses assembly of the periscope camera module, wherein the flexible circuit board layer further includes a third part of flexible circuit board layer, and the third flexible circuit board layer is connected to the first flexible circuit board layer through the second flexible circuit board layer, and the first part of flexible circuit board layer, the second part of flexible circuit board layer and the third part of flexible circuit board layer are located on a same line, and the circuit board further includes a lenses assembly connection portion, and the lenses assembly connection portion includes at least part of the third part of flexible circuit board layer.

According to an embodiment of the present invention, after inverting the bending portion, at least part of the flexible circuit board layer located at the bending portion and close to one end of the chip connection portion is separated from the first part of rigid circuit board layer.

According to an embodiment of the present invention, after inverting the bending portion, at least part of the flexible circuit board layer located at the chip connection portion and close to one end of the bending portion is separated from the second part of rigid circuit board layer.

According to an embodiment of the present invention, after inverting the bending portion, the bent part of the flexible circuit board layer located between the bending portion and the chip connection portion does not protrude from the first part of rigid circuit board layer or the second part of rigid circuit board layer.

According to another aspect of the present invention, the present invention provides an installation method of the circuit board above mentioned, which includes the following steps:
mounting a photosensitive chip on a front side of the chip connection portion of the circuit board;
fixing the chip connection portion to a lenses holder of a periscope camera module; and
inverting a lenses assembly connection portion of the circuit board to be connected to a periscope lenses assembly of the periscope camera module.

According to an embodiment of the present invention, the flexible circuit board layer further includes a third part of flexible circuit board layer, and the first part of flexible circuit board layer has a first side and a second side, and the first side and the second side are adjacent, and the second part of flexible circuit board layer and the third part of flexible circuit board layer respectively extend to the first side and the second side, and the lenses assembly connection portion includes at least part of the third part of flexible circuit board layer.

According to an embodiment of the present invention, the flexible circuit board layer further includes a third part of flexible circuit board layer, and the third flexible circuit board layer is connected to the first flexible circuit board layer through the second flexible circuit board layer, and the first part of flexible circuit board layer, the second part of flexible circuit board layer and the third part of flexible circuit board layer are located on a same line, and the lenses assembly connection portion includes at least part of the third part of flexible circuit board layer.

According to an embodiment of the present invention, the installation method further includes the following steps:

inverting the bending portion of the circuit board to the rear side of the chip connection portion.

According to another aspect of the present invention, the present invention provides an installation method of the circuit board above mentioned, which includes the following steps:

inverting a lenses assembly connection portion of the circuit board to be connected to a periscope lenses assembly connected to a periscope camera module; and inverting the chip connection portion so that the chip connection portion with a photosensitive chip connection portion is connected to a lenses holder of the periscope camera module.

SPECIFIC EMBODIMENTS

Figure 1:
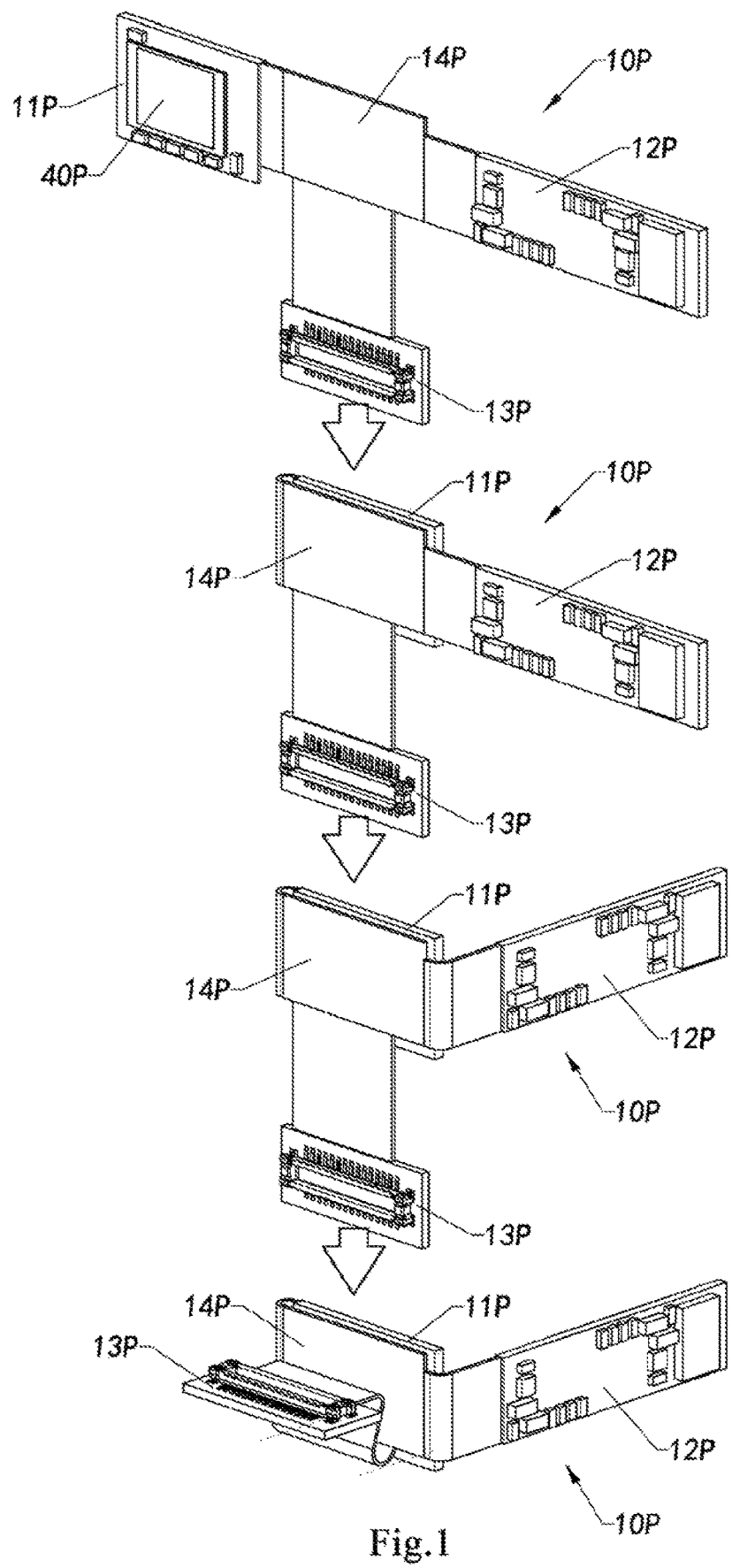
FIG. 1 is a schematic diagram of installation of a circuit board according to the prior art.

The following description is used to disclose the present invention so that those skilled in the art can implement the present invention. The preferred embodiments in the following description are only examples, and those skilled in the art can think of other obvious variations. The basic principles of the present invention defined in the following description can be applied to other embodiments, modifications, improvements, equivalents, and other technical solutions without departing from the spirit and scope of the present invention.

Those skilled in the art should understand that in the disclosure of the present invention, the orientation or positional relationship indicated by the terms such as "longitudinal", "lateral", "upper", "lower", "front", "rear", "left", "right", "vertical", "horizontal", "top", "bottom", "inner" and "outer" is based on the orientation or positional relationship shown in the drawings, and they are only for the convenience of describing the invention and simplifying the description, rather than indicating or implying that the device or element referred to must have a specific orientation, be constructed and operated in a specific orientation, so the above terms should not be understood as limiting the present invention.

It can be understood that, the term "a/an" should be understood as "at least one" or "one or more", i.e., in one embodiment, the number of an element may be one, and in another embodiment, the number of the element may be more than one, so the term "a/an" cannot be understood as a restriction on the number.

Figure 3:
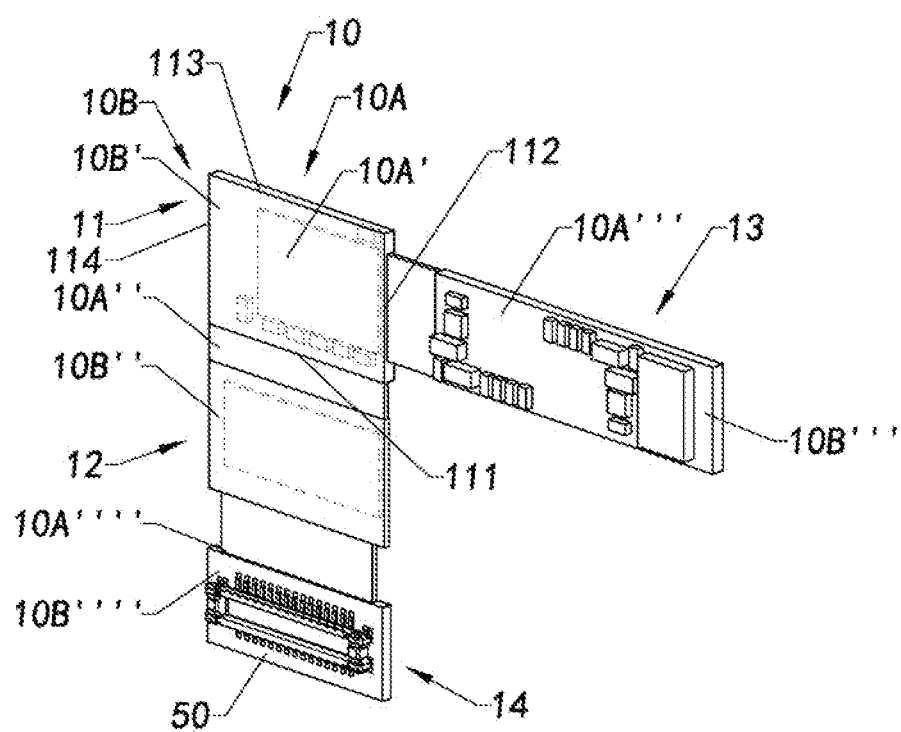
FIG. 3 is a schematic diagram of a circuit board according to a preferred embodiment of the present invention.
Figure 4:
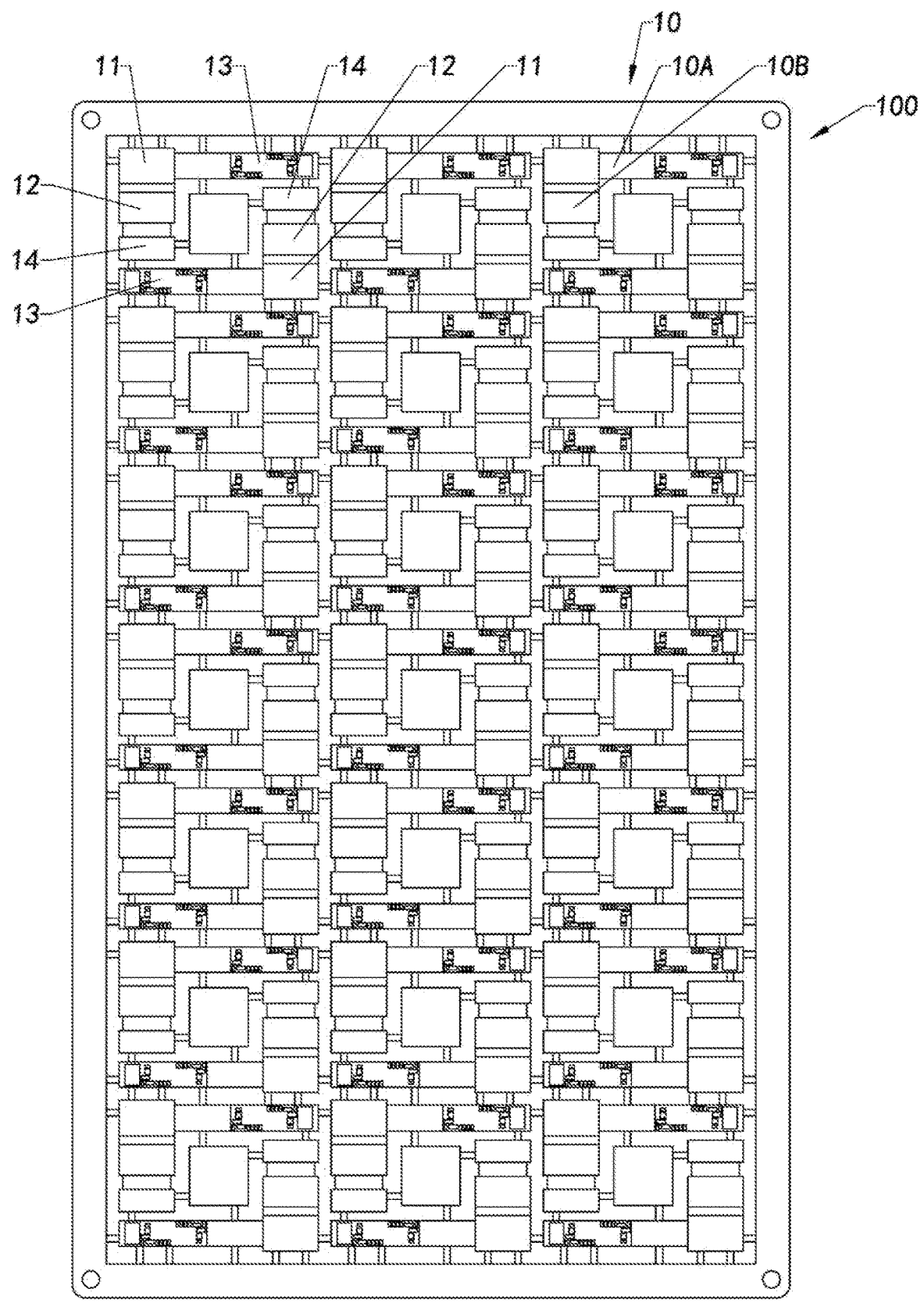
FIG. 4 is a schematic diagram of a circuit board jointed panel according to a preferred embodiment of the present invention.
Figure 5:
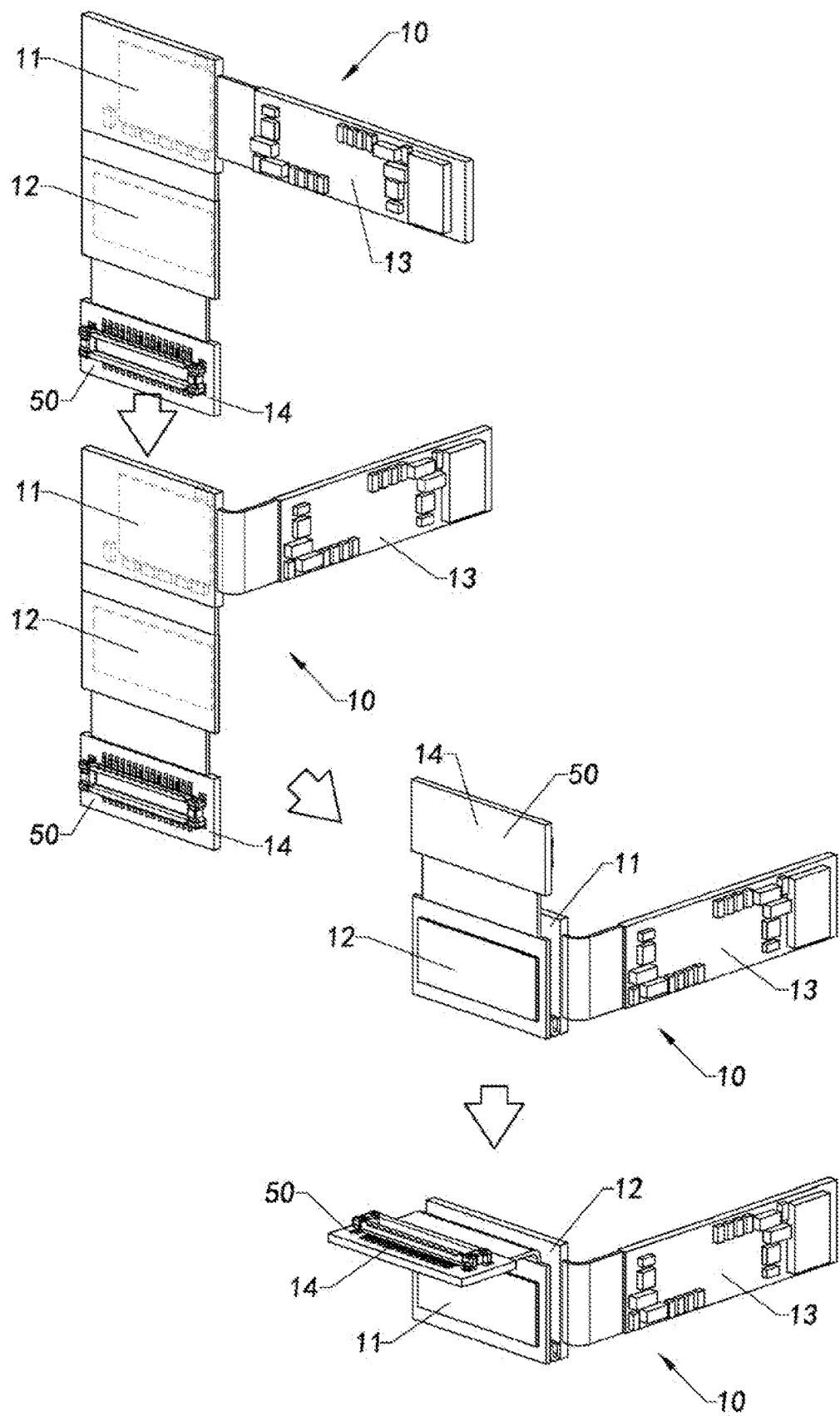
FIG. 5 is a schematic diagram of an assembling process of a circuit board according to a preferred embodiment of the present invention.
Figure 8:
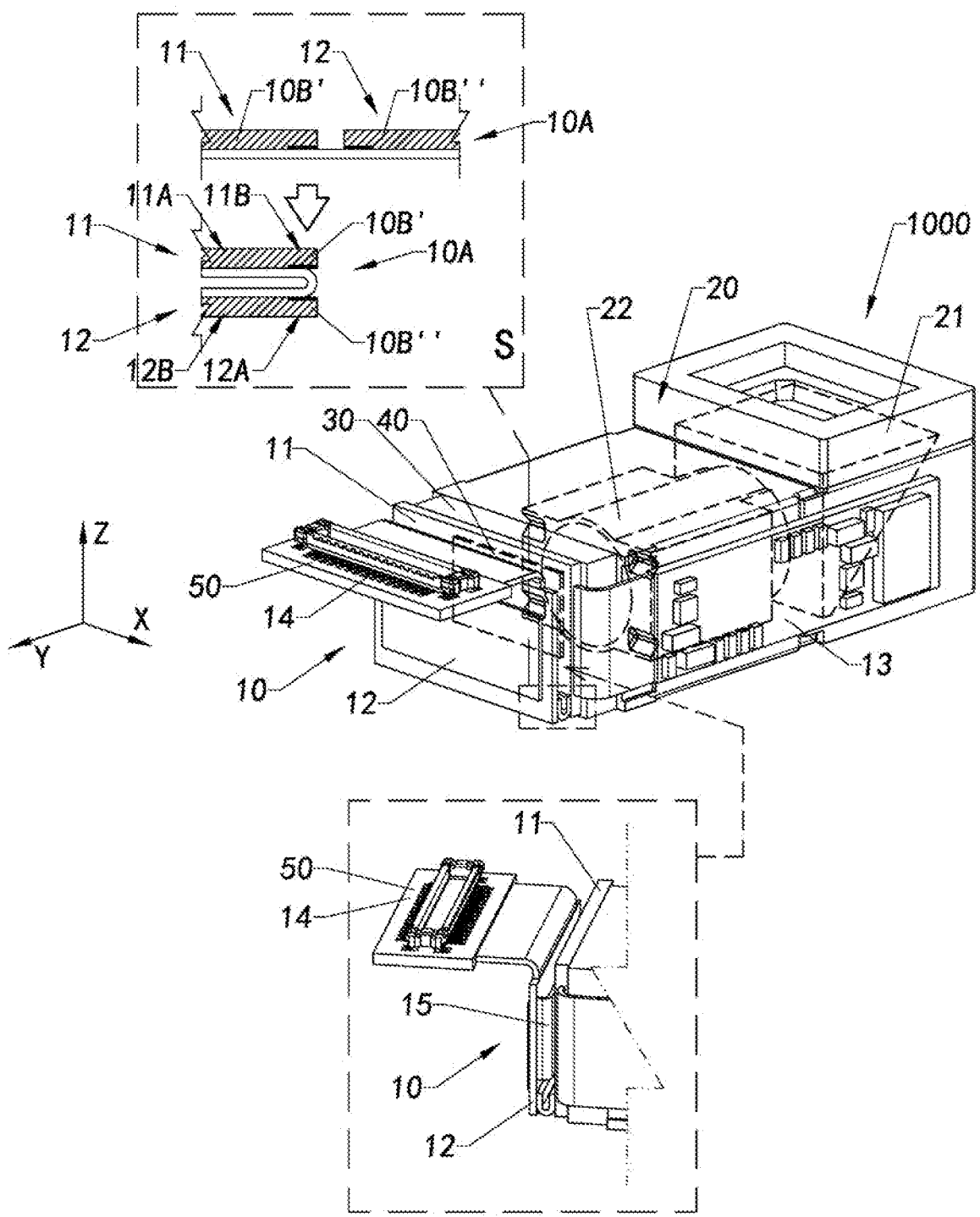
FIG. 8 is a schematic diagram of a periscope camera module according to a preferred embodiment of the present invention.
Figure 13:
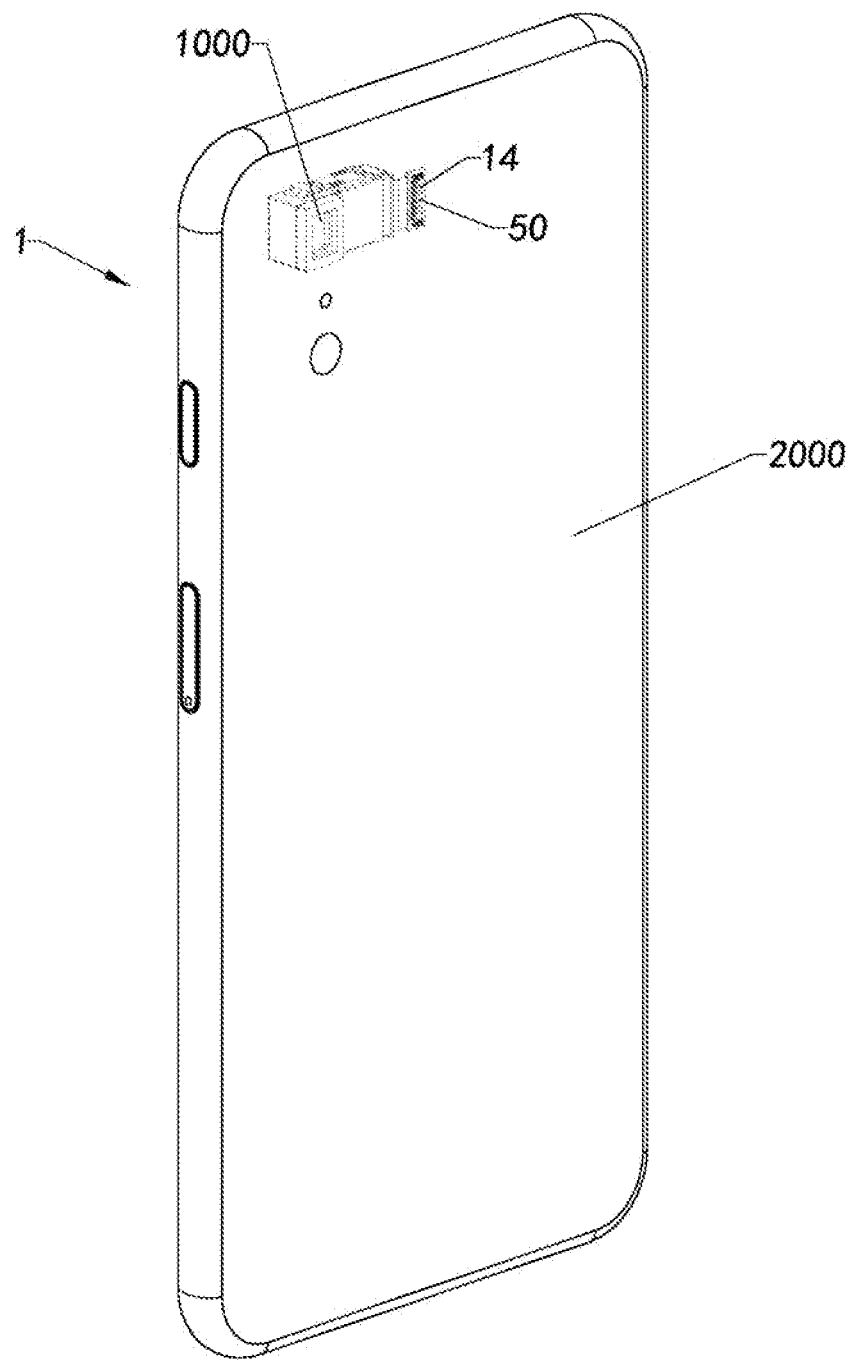
FIG. 13 is a schematic diagram of an electronic device according to a preferred embodiment of the present invention.

With reference to FIGS. 3-5, and with reference to FIGS. 8 and 13, a circuit board 10 according to a preferred embodiment of the present invention is illustrated.

Figure 2:
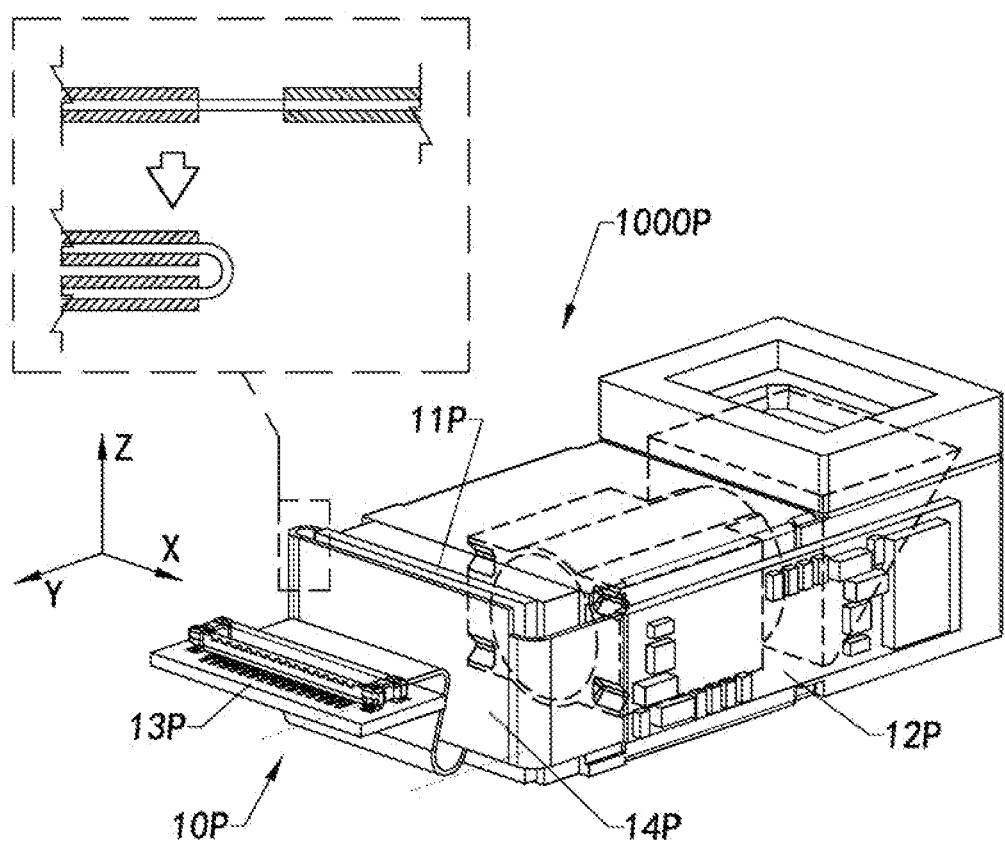
FIG. 2 is a schematic diagram of a periscope camera module according to the prior art.

The size of the circuit board 10 can be designed to be small. When applied to a periscope camera module 1000, the size of the periscope camera module 1000, especially size in height, can be reduced to adapt to the current development trend of thinner and lighter electronic equipment. The Z axis of the coordinate axis in FIG. 2 represents a height direction.

Particularly, the circuit board 10 includes a flexible circuit board layer 10A and a rigid circuit board layer 10B, wherein the flexible circuit board layer 10A has a front side, and the rigid circuit board layer 10B is arranged on the front side of the flexible circuit board layer 10A. The flexible circuit board layer 10A can be bent easily, while the rigid circuit board layer 10B cannot be bent, and once it is bent, its rigid structure will be destroyed and result in fracture of the rigid circuit board layer 10B.

The circuit board 10 provided in this embodiment has a two-layer structure. Compared with the circuit board 10P of the three-layer structure shown in FIG. 1, the thickness of the circuit board 10 in this embodiment can be designed thinner. More particularly, the circuit board 10P of the three-layer structure shown in FIG. 1 needs to arrange rigid boards symmetrically on both sides of a flexible board to make it be stressed uniformly; but for the circuit board 10 provided in this embodiment, it is possible to avoid a structure that may not play a functional role but is only arranged for being stressed uniformly, so the circuit board 10 can be designed to be thinner.

Further, the circuit board 10 includes a chip connection portion 11, a bending portion 12, a lenses assembly connection portion 13, and a connecting strap connection portion 14, wherein the bending portion 12 is located between the chip connection portion 11 and the connecting strap connection portions 14, the chip connection portion 11 is connected between the bending portion 12 and the lenses assembly connection portion 13. The bending portion 12 can be bent to the chip connection portion 11. Preferably, the bending portion 12 can be bent to be parallel to the chip connection portion 11.

The chip connection portion 11 is adapted to be electrically connected to a photosensitive chip 40 of the periscope camera module 1000, and the lenses assembly connection portion 13 is adapted to be electrically connected to a periscope lenses assembly 20 of the periscope camera module 1000. The connecting strap connection portion 14 is adapted to be electrically connected to a connecting strap 50.

The rigid circuit board layer 10B includes a first part of rigid circuit board layer 10B' and a second part of rigid circuit board layer 10B", wherein the bending portion 12 includes the second part of rigid circuit board layer 10B" and a part of the flexible circuit board layer 10A overlapping the second part of rigid circuit board layer 10B", the chip connection portion 11 includes the first part of rigid circuit board layer 10B' and a part of the flexible circuit board layer 10A overlapping the first part of rigid circuit board layer 10B'. The second part of rigid circuit board layer 10B" and the first part of rigid circuit board layer 10B' are arranged at interval on the flexible circuit board layer 10A. The flexible circuit board layer 10A has a front side and a rear side, wherein the rigid circuit board layer 10B is arranged on the front side of the flexible circuit board layer 10A. That is, the first part of rigid circuit board layer 10B' and the second part of rigid circuit board layer 10B" are both located on a same side of the flexible circuit board layer 10A.

More particularly, the flexible circuit board layer 10A includes a first part of flexible circuit board layer 10A', a second part of flexible circuit board layer 10A", and a third part of flexible circuit board layer 10A''', wherein the first part of flexible circuit board layer 10A' is respectively connected to the second part of flexible circuit board layer 10A" and the third part of flexible circuit board layer 10A'''.

Further, the first part of flexible circuit board layer 10A' has a first side 111 and a second side 112, wherein the first side 111 and the second side 112 are adjacent. In this embodiment, the first part of flexible circuit board layer 10A' is a rectangular structure, and the first part of flexible circuit board layer 10A' further has a third side 113 and a fourth side 114; the first side 111 is opposite to the third side 113, and the second side 112 is opposite to the fourth side 114. The first side 111 is respectively connected to the second side 112 and the fourth side 114, and the third side 113 is respectively connected to the fourth side 114 and the second side 112.

In this embodiment, the second part of flexible circuit board layer 10A" extends outward from the first side 111 of the first part of flexible circuit board layer 10A', and the third part of flexible circuit board layer 10A''' extends outward from the second side 112 of the first part of flexible circuit board layer 10A', and there is an angle included between the second part of flexible circuit board layer 10A" and the first part of flexible circuit board layer 10A'. Preferably, the included angle is a right angle to facilitate the inversion of the second part of flexible circuit board layer 10A" relative to the first part of flexible circuit board layer 10A', and the inversion of the third part of flexible circuit board layer 10A''' relative to the first part of flexible circuit board layer 10A'.

That is, the flexible circuit board layer has an L-shaped structure, and the first part of flexible circuit board layer 10A' is located at a corner position.

In other embodiments of the present invention, when the second part of flexible circuit board layer 10A" extends outward from the first side 111 of the first part of flexible circuit board layer 10A', a part of the third part of flexible circuit board layer 10A''' may be arranged to extend outward from the fourth side 114 of the first part of flexible circuit board layer 10A'. In other embodiments of the present invention, when the second part of flexible circuit board layer 10A" extends outward from the third side 113 of the first part of flexible circuit board layer 10A', a part of the third part of flexible circuit board layer 10A''' may be arranged to extend outward from the fourth side 114 of the first part of flexible circuit board layer 10A'. In other embodiments of the present invention, when the second part of flexible circuit board layer 10A" extends outward from the third side 113 of the first part of flexible circuit board layer 10A', a part of the third part of flexible circuit board layer 10A''' may be arranged to extend outward from the second side 112 of the first part of flexible circuit board layer 10A'.

The first part of rigid circuit board layer 10B' of the rigid circuit board layer 10B is arranged on the second part of flexible circuit board layer 10A" of the flexible circuit board layer 10A, and the second part of rigid circuit board layer 10B" is arranged on the first part of flexible circuit board layer 10A'.

The bending portion 12 includes the second part of rigid circuit board layer 10B" and a part of the second part of flexible circuit board layer 10A" overlapping the second part of rigid circuit board layer 10B".

The chip connection portion 11 includes the first part of rigid circuit board layer 10B' and the first part of flexible circuit board layer 10A' overlapping the first part of rigid circuit board layer 10B'.

The lenses assembly connection portion 13 includes at least part of the third part of flexible circuit board layer 10A'''; and the lenses assembly connection portion 13 is connected to the chip connection portion 11 in an invertible manner relative to the chip connection portion 11.

The flexible circuit board layer 10A further includes a fourth part of flexible circuit board layer 10A"", wherein the fourth part of flexible circuit board layer 10A"" extends to the second part of flexible circuit board layer 10A", the second part of flexible circuit board layer 10A" is located between the fourth part of flexible circuit board layer 10A"" and the first part of flexible circuit board layer 10A'; and the first part of flexible circuit board layer 10A', the second part of flexible circuit board layer 10A", and the fourth part of flexible circuit board layer 10A"" are located on a same straight line; and the first part of flexible circuit board layer 10A' and the third part of flexible circuit board layer 10A''' is located on a same straight line. Preferably, the circuit board 10 is an L-shaped structure.

The connecting strap connection portion 14 includes at least part of the fourth part of flexible circuit board layer 10A"", and the connecting strap connection portion 14 is connected to the bending portion 12 in an invertible manner. The bending portion 12 is located between the connecting strap connection portion 14 and the chip connection portion 11.

Further, the rigid circuit board layer 10B may also include a third part of rigid circuit board layer 10B''' and a fourth part of rigid circuit board layer 10B""; the third part of rigid circuit board layer 10B''' and the fourth part of rigid circuit board layer 10B"" are respectively arranged at interval on the front side of the flexible circuit board layer 10A.

The lenses assembly connection portion 13 includes the third part of rigid circuit board layer 10B''' and a part of the third part of flexible circuit board layer 10A''' of the flexible circuit board layer 10A overlapping the third part of rigid circuit board layer 10B'''. The connecting strap connection portion 14 includes the fourth part of rigid circuit board layer 10B"" and the fourth part of flexible circuit board layer 10A"" of the flexible circuit board layer 10A overlapping the fourth part of rigid circuit board layer 10B"".

It can be understood that, in other embodiments of the present invention, the rigid circuit board layer 10B includes the second part of rigid circuit board layer 10B" and the first part of rigid circuit board layer 10B'. The rigid circuit board layer 10B can provide a flat mounting surface to facilitate subsequent installation. For example, when a photosensitive chip 40 is mounted on the chip connection portion 11, the second part of rigid circuit board layer 10B" of the chip connection portion 11 may facilitate the photosensitive chip 40 to be mounted flat on the chip connection portion 11.

Further, the bending portion 12 and the chip connection portion 11 are connected through a part of the flexible circuit board layer 10A, and the bending portion 12 is bendably connected to the chip connection portion 11.

The lenses assembly connection portion 13 and the chip connection portion 11 are connected through a part of the flexible circuit board layer 10A, and the periscope lenses assembly 20 is bendably connected to the chip connection portion 12.

The connecting strap connection portion 14 and the bending portion 12 are connected through a part of the flexible circuit board layer 10A, and the connecting strap connection portion 14 is bendably connected to the bending portion 12.

The connecting strap connection portion 14 is connected to the chip connection portion 11 through the bending portion 12. In other words, a part of the flexible circuit board layer 10A between the connecting strap connection portion 14 and the chip connection portion 11 may be bent twice. The connecting strap connection portion 14 and the lenses assembly connection portion 13 are respectively located at two ends.

The circuit board 10 can be manufactured by an additive method. For example, the flexible circuit board layer 10A may be provided first, and then a metal circuit is formed by copper plating or etching process, and an insulating layer is formed on this basis to form the rigid circuit board layer 10B, a multilayer circuit board 10 may be obtained by repeating this process, and the rigid circuit board layer 10 is formed only on one side of the flexible circuit board 10. Of course, the above steps are only examples for illustration, and do not limit the present invention.

Further, in this embodiment, the circuit board 10 has an L-shaped structure. That is to say, the flexible circuit board layer 10A extends toward the position of the bending portion 12 from the position of the connecting strip connection portion 14, then extends along to the chip connection portion 11, and then turns and extends toward the position of the periscope lenses assembly 20.

An included angle between an extending direction of a part of the flexible circuit board layer 10A extending between the lenses assembly connection portion 13 and the chip connection portion 11 and an extending direction of a part of the flexible circuit board layer 10A extending between the connecting strap connection portion 14 and the chip connection portion 11 is 90 degrees. Compared with the T-shaped circuit board 10P shown in FIG. 1, the size of the circuit board 10 provided in this embodiment can be designed to be smaller, and the chip connection portion 11 may be mounted with the photosensitive chip 40 and is also directly connected to the lenses assembly connection portion 13 and the connecting strap connection portion 14, thereby improving the effective availability of the entire circuit board 10. More particularly, compared to the T-shaped circuit board 10P shown in FIG. 1, the circuit board 10 provided in this embodiment does not need an avoidance in the Z direction, i.e., in the height direction, so that one time of bending may be omitted and the size of the entire circuit board 10 may be designed to be smaller.

Further, when the circuit board 10 is bent for assembly, taking the bending between the connecting strap connection portion 14 and the chip connection portion 11 as an example, when the connecting strap connection portion 14 is bent to the chip connection portion 11, especially when the connecting strap connection portion 14 is bent toward a rear side of the chip connection portion 11, a part of the flexible circuit board layer 10A located between the connecting strap connection portion 14 and the chip connection portion 11 may not protrude from the chip connection portion 11.

More particularly, the chip connection portion 11 has a front side and the rear side, the front and rear sides of the chip connection portion 11 are arranged opposite to each other, and the front side of the chip connection portion 11 is used for installation of the photosensitive chip 40.

A complete periscope camera module 1000 includes the periscope lenses assembly 20 and a photosensitive assembly, wherein the photosensitive assembly includes a lenses holder 30, the photosensitive chip 40, and the circuit board 10, wherein the photosensitive chip 40 is mounted on the circuit board 10, the lenses holder 30 has a light window, and the periscope lenses assembly 20 is held on a photosensitive path of the photosensitive chip 40 through the lenses holder 30. In other words, the light is turned by the periscope lenses assembly 20 and is received by the photosensitive chip 40 through the light window.

The periscope lenses assembly 20 includes a light turning mechanism 21 and a lenses mechanism 22, wherein the light turning mechanism 21 has a light entrance, after the light enters through the light entrance, it is turned about 90 degrees at the light turning mechanism 21, and then passes through the lenses mechanism 22 to reach the photosensitive chip 40 to be received.

The light turning mechanism 21 may further include a light turning member and a first motor, wherein the light turning member is drivably connected to the first motor. The lenses mechanism 22 may further include a lenses and a second motor, wherein the lenses is drivably connected to the second motor. The lenses assembly connection portion 13 adapted to be electrically connected to the periscope lenses assembly 20 may be conductively connected to the first motor and the second motor respectively, the periscope lenses assembly 20 may receive or transmit some electrical signals through the circuit board 10.

When the circuit board 10 is mounted on the lenses holder 30 of the photosensitive assembly of the periscope camera module 1000, the arrangement of more components in the height direction can be achieved by bending the circuit board 10, and in such case the height of the entire periscope camera module 1000 is not increased. It can be understood that the height direction at this time refers to the thickness direction of the electronic device when the periscope camera module 1000 is mounted on the electronic device; and this direction is the height direction of the electronic device when the electronic device is placed horizontally on the desktop.

The connecting strap connection portion 14 is connected to the chip connection portion 11 in an invertible manner, when the connecting strap connection portion 14 is inverted relative to the chip connection portion 11 and is inverted toward the rear side of the chip connection portion 11, in order to reduce the size of the circuit board 10 in the height direction, so as to reduce the size of the periscope camera module 1000 in the height direction, a part of the flexible circuit board layer 10A located between the connecting strip connection portion 14 and the chip connection portion 11 is bent at the rear side of the chip connection portion 11, or even bent multiple times, to reduce the size of the circuit board 10 in the height direction.

More particularly, when the connecting tape connection portion 14 is inverted relative to the chip connection portion 11, the bending portion 12 is inverted at the rear side of the chip connection portion 11. The arrangement of the first rigid circuit board layer 10B of the bending portion 12 facilitates the positioning of the circuit board 10 after being bent.

The bending portion 12 includes the second part of rigid circuit board layer 10B" and the second part of flexible circuit board layer 10A" of the flexible circuit board layer 10A overlapping the second part of rigid circuit board layer 10B", the chip connection portion 11 includes the first part of rigid circuit board layer 10B' and the first part of flexible circuit board layer 10A' of the flexible circuit board layer 10A overlapping the first part of rigid circuit board layer 10B'.

When the second part of rigid circuit board layer 10B" is inverted relative to the first part of rigid circuit board layer 10B', i.e., the bending portion 12 is inverted relative to the chip connection portion 11, a part of the flexible circuit board layer 10A located between the bending portion 12 and the chip connection portion 11 does not protrude from the bending portion 12 or the chip connection portion 11. In other words, the bent part of the flexible circuit board layer 10A located between the first part of rigid circuit board layer 10B' and the second part of rigid circuit board layer 10B" does not protrude from the first part of rigid circuit board layer 10B' or the second part of rigid circuit board layer 10B", so as to facilitate to reduce the overall size of the circuit board 10. In other words, when the circuit board 1000 is bent, the lowest point of the flexible circuit board layer 10A in the height direction can be higher than the lowest point of the rigid circuit board layer 10B in the height direction, so that the flexible circuit board layer 10A does not contribute to the size of the circuit board 10 in the height direction.

More particularly, for the bending portion 12 and the chip connection portion 11, when the bending portion 12 is inverted toward the rear side of the chip connection portion 11, a part of the flexible circuit board layer 10A of the bending portion 12 faces a part of the flexible circuit board layer 10A of the chip connection portion 11, so that there is no need to avoid the rigid circuit board layer 10B during the inversion process, thereby the length of a part of the flexible circuit board layer 10A located between the bending portion 12 and the chip connection portion 11 extending outward may be reduced.

Further, a part of the flexible circuit board layer 10A of the chip connection portion 11 overlapping the first part of rigid circuit board layer 10B' is at least partially and detachably connected to the first part of rigid circuit board layer 10B', and a part of the flexible circuit board layer 10A of the bending portion 12 overlapping the second part of rigid circuit board layer 10B" is at least partially and detachably connected to the second part of rigid circuit board layer 10B". Particularly referring to the enlarged schematic part of the S position in FIG. 8, it shows that at least part of the flexible circuit board layer 10A is detachably connected to the rigid circuit board layer 10B.

Correspondingly, at least part of the flexible circuit board layer 10A of the chip connection portion 11 overlapping the first part of rigid circuit board layer 10B' is fixedly connected to the first part of rigid circuit board layer 10B', and at least part of the flexible circuit board layer 10A of the bending portion 12 overlapping the second part of rigid circuit board layer 10B" is fixedly connected to the second part of rigid circuit board layer 10B", so that the length of a part of the flexible circuit board layer 10A located between the bending portion 12 and the chip connection portion 11 can be reduced.

Further, the circuit board 10 further includes a reinforcing member 15. In this embodiment, the reinforcing member 15 is arranged on the part of the second part of flexible circuit board layer 10A" of the flexible circuit board layer 10A of the bending portion 12, so as to prevent the flexible circuit board layer 10A and the second part of rigid circuit board layer 10B" from being completely separated. The reinforcing member 15 may also be arranged on the first part of flexible circuit board layer 10A' of the flexible circuit board layer 10A of the chip connection portion 11, so as to prevent the flexible circuit board layer 10A and the first part of rigid circuit board layer 10B' from being completely separated. Of course, it is understandable that other ways may be used to reinforce the part of the flexible circuit board layer 10A of the bending portion 12 and the second part of rigid circuit board layer 10B", and the part of the flexible circuit board layer 10A of the chip connection portion 11 and the first part of rigid circuit board layer 10B', the above examples do not limit the present invention.

It is understandable that the part of the flexible circuit board layer 10A located between the bending portion 12 and the chip connection portion 11 has a predetermined length, so that the bending portion 12 can be inverted relative to the chip connection portion 11.

When the bending portion 12 is inverted relative to the chip connection portion 11, at least part of the first part of flexible circuit board layer 10A' of the flexible circuit board layer 10A that overlaps the first part of rigid circuit board layer 10B' and is close to the second part of rigid circuit board layer 10B" is separated from the first part of rigid circuit board layer 10B', and at least part of the second part of flexible circuit board layer 10A" of the flexible circuit board layer 10A that overlaps the second part of rigid circuit board layer 10B" and is close to the first part of rigid circuit board layer 10B' is separated from the second part of rigid circuit board layer 10B", so that when the bending portion 12 is inverted to the photosensitive chip 40, a part of the flexible circuit board layer 10A located between the bending portion 12 and the chip connection portion 11 extending outward can be designed to be shorter, and the outward direction is relative to the second part of rigid circuit board layer 10B" of the bending portion 12 and the first part of rigid circuit board layer 10B' of the chip connection portion 11, preferably, the flexible circuit board layer 10A located between the bending portion 12 and the chip connection portion 11 may not protrude from the second part of rigid circuit board layer 10B" and the first part of rigid circuit board layer 10B' in the Z direction at all, so as to facilitate to reduce the size of the circuit board 10 in the height direction.

More particularly, the bending portion 12 has a first bending end and a second bending end, wherein the first bending end and the second bending end are respectively located at two ends; and the chip connection portion 11 has a first connecting end and a second connecting end, wherein the first connecting end and the second connecting end are respectively located at two ends; wherein the first connecting end of the chip connection portion 11 is far away from the bending portion 12, and the second connecting end of the chip connection portion 11 is close to the bending portion 12, when the bending portion 12 is not inverted relative to the chip connection portion 11, and the second bending end of the bending portion 12 is far away from the chip connection portion 12, and the first bending end of the bending portion 12 is close to the chip connection portion 12.

When the bending portion 12 is inverted to the rear side of the chip connection portion 11, the second bending end of the bending portion 12 and the first connecting end of the chip connection portion 11 are arranged face-to-face, the first bending end of the bending portion 12 and the second connecting end of the chip connection portion 11 are arranged face-to-face, and the bending of the flexible circuit board layer 10A occurs between the first bending end of the bending portion 12 and the second connecting end of the chip connection portion. It can be understood that, the rear side of the chip connection portion 11 refers to a side opposite to the side of the chip connection portion 11 mounted with the photosensitive chip 40.

The second part of flexible circuit board layer 10A" of the bending portion 12 located at the first bending end is detachably connected to the corresponding part of the second part of rigid circuit board layer 10B". When this position needs to face greater stress due to bending, the second part of flexible circuit board layer 10A" and the second part of rigid circuit board layer 10B" of the bending portion 12 are partially separated to reduce the stress at this location and avoid tearing.

The first part of flexible circuit board layer 10A' of the chip connection portion 11 located at the second connecting end is detachably connected to the corresponding part of the first part of rigid circuit board layer 10B'. When this position needs to face greater stress due to bending, the second part of rigid circuit board layer 10B' and the second part of flexible circuit board 10A" of the chip connection portion 11 are partially separated to reduce the stress at this position and avoid tearing.

More particularly, the bending portion 12 includes a first part of bending portion 12A and a second part of bending portion 12B, wherein the first part of bending portion 12A extends to the second part of bending portion 12B, and the first part of bending portion 12A is close to the chip connection portion 11 relative to the second part of bending portion 12.

The chip connection portion 11 includes a first part of chip connection portion 11A and a second part of chip connection portion 11B, wherein the first part of chip connection portion 11A extends to the second part of chip connection portion 11B, and the second part of chip connection portion 11B is close to the bending portion 12 relative to the first part of chip connection portion 11A.

The first part of bending portion 12A includes at least part of the flexible circuit board layer 10A and at least part of the rigid circuit board layer 10B. More particularly, the first part of bending portion 12A includes at least part of the second part of rigid circuit board layer 10B" and the second part of flexible circuit board layer 10A" overlapping the second part of rigid circuit board layer 10B", the second part of bending portion 12B includes at least part of the second part of rigid circuit board layer 10B" and the second part of flexible circuit board layer 10A" overlapping the second part of rigid circuit board layer 10B", wherein the second part of rigid circuit board layer 10B" of the first part of bending portion 12A is detachably connected to the second part of flexible circuit board layer 10A".

The first part of chip connection portion 11A includes at least part of the flexible circuit board layer 10A and at least part of the rigid circuit board layer 10B. More particularly, the first part of chip connection portion 11A includes at least part of the first part of rigid circuit board layer 10B' and the first part of flexible circuit board layer 10A' overlapping the first part of rigid circuit board layer 10B', the second part of chip connection portion 11B includes at least part of the first part of rigid circuit board layer 10B' and the first part of flexible circuit board layer 10A' overlapping the first part of rigid circuit board layer 10B', wherein the first part of rigid circuit board layer 10B' of the second part of chip connection portion 11B is detachably connected to the first part of flexible circuit board layer 10A'.

Furthermore, when the bending portion 12 is inverted relative to the chip connection portion 11, a part of the flexible circuit board layer 10A of the adjacent the second part of chip connection portion 11B and the first part of bending portion 12A can be separated from the corresponding part of the rigid circuit board layer 10B.

It is worth mentioning that, the length of the flexible circuit board layer 10A located between the bending portion 12 and the chip connection portion 11 may be designed to be shorter, and preferably does not protrude from the bending portion 12 and the chip connection portion 11 in the Z direction, so as to facilitate to reduce the height size of the circuit board 10.

Optionally, after the bending portion 12 is inverted, the bending portion 12 and the chip connection portion 11 are arranged oppositely. Preferably, the size of the bending portion 12 is set to be smaller than the size of the chip connection portion 11 to facilitate to reduce the size of the circuit board 10, especially the size in the height direction. Optionally, after being inverted, the bending portion 12 is relatively parallel to the chip connection portion 11.

When the periscope camera module 1000 is installed in the electronic device, the circuit board 10 is located in a direction perpendicular to the electronic device, the flexible circuit board layer 10A between the bending portion 12 and the chip connection portion 11 is located in the vertical direction, so that shortening the outwardly extending part of the flexible circuit board layer 10A can reduce the size of the circuit board 10 in the height direction.

In other words, the size of the circuit board 10 provided in this embodiment is relatively small, not only the size in area but also the size in thickness, as well as the size in height of the circuit board 10 during usage can also be reduced.

Further, the circuit board 10 can be manufactured by a circuit board jointed panel, and a plurality of the circuit boards 10 can be manufactured at a time. Particularly, according to another aspect of the present invention, the present invention provides a circuit board jointed panel 100, wherein the circuit board jointed panel 100 includes a plurality of the circuit boards 10, wherein the circuit board 10 includes the flexible circuit board layer 10A and a plurality of the rigid circuit board layers 10B, wherein the rigid circuit board layer 10B is arranged at interval on the flexible circuit board layer 10A. Each of the rigid circuit board layers 10B includes the second part of rigid circuit board layer 10B" and the first part of rigid circuit board layer 10B', and may also include the third part of rigid circuit board layer 10B''' and the fourth part of rigid circuit board layer 10B''''.

The circuit board jointed panel 100 may be cut into individual circuit boards 10, so as to manufacture a plurality of the circuit boards 10 in batches.

It is worth mentioning that, due to the reduction of the size of the circuit board 10, a larger number of the circuit boards 10 may be manufactured in a same molding due, thereby improving the manufacturing efficiency of the circuit board 10 and save manufacturing cost.

Referring to FIG. 5, an assembling process of the circuit board 10 according to the above embodiments of the present invention is illustrated. The other components of the periscope camera module 1000 are not shown in FIG. 5, only the structural change of the circuit board 10 is taken as an example for description, and at the same time, reference may also be made to FIG. 8

The circuit board 10 may be mounted with a connecting strap 50, wherein the connecting strap 50 is used to connect another device, such as the electronic device, or other camera modules installed in the electronic device.

The photosensitive chip 40 can be mounted on the circuit board 10, and then the circuit board 10 with the photosensitive chip 40 can be assembled on the lenses holder 30 of the periscope camera module 1000, for example by mounting, so that the periscope lenses assembly 20 of the periscope camera module 1000 is held in the photosensitive path of the photosensitive chip 40 through the lenses holder 30.

As for the chip connection portion 11 with respect to the circuit board 10P shown in FIG. 1, firstly the first bending portion 11P is inverted relative to the connection portion 14P during the installation process of the circuit board 10P, and then the second bending portion 12P is inverted relative to the connection portion 14P, wherein the first bending portion 11P is used for connecting to the photosensitive chip 40P, and the second bending portion 12P is used for connecting a motor. The accuracy of the second bending in this process is based on the premise of the first bending. Therefore, in order to ensure the alignment accuracy between the second bending and the motor solder joints, the first bending requires additional molding die to limit the position and ensure accuracy; while in this example, the circuit board 10 is positioned on the lenses holder 30, and the lenses assembly connection portion 13 only needs to be inverted relative to the chip connection portion 11, thus no additional molding die is needed to locate the chip connection portion 11.

Then, the lenses assembly connection portion 13 is assembled to the periscope lenses assembly 20 of the periscope camera module 1000. Particularly, the lenses assembly connection portion 13 is inverted toward the front side of the flexible circuit board layer 10A, and then the periscope lenses assembly 20 is fixed to a corresponding position of the periscope lenses assembly 20. In this process, there is no need to position the bending portion 12 and the connecting strap connection portion 14.

Then the bending portion 12 is inverted toward the rear side of the chip connection portion 11, preferably, a part of the flexible circuit board layer 10A inverted between the bending portion 12 and the chip connection portion 11 does not protrude from the second part of rigid circuit board layer 10B" and the first part of rigid circuit board layer 10B' of the bending portion 12.

Finally, the connecting strap connection portion 14 is inverted to an outward position for connecting to other electronic devices.

It is worth noting that, in the entire assembling process of the circuit board 10, no positioning-related molding dies are needed, and thus it is beneficial to reduce the difficulty of manufacturing. Further, for the circuit board 10P shown in FIG. 1, it needs to be inverted four times in the assembling process to complete the assembly, while the circuit board 10 provided in this embodiment only needs to be inverted three times to complete the assembly, and the height size of the entire circuit board 10 is reduced at the same time, so as to facilitate to reduce the height size of the entire periscope camera module 1000.

Figure 6:
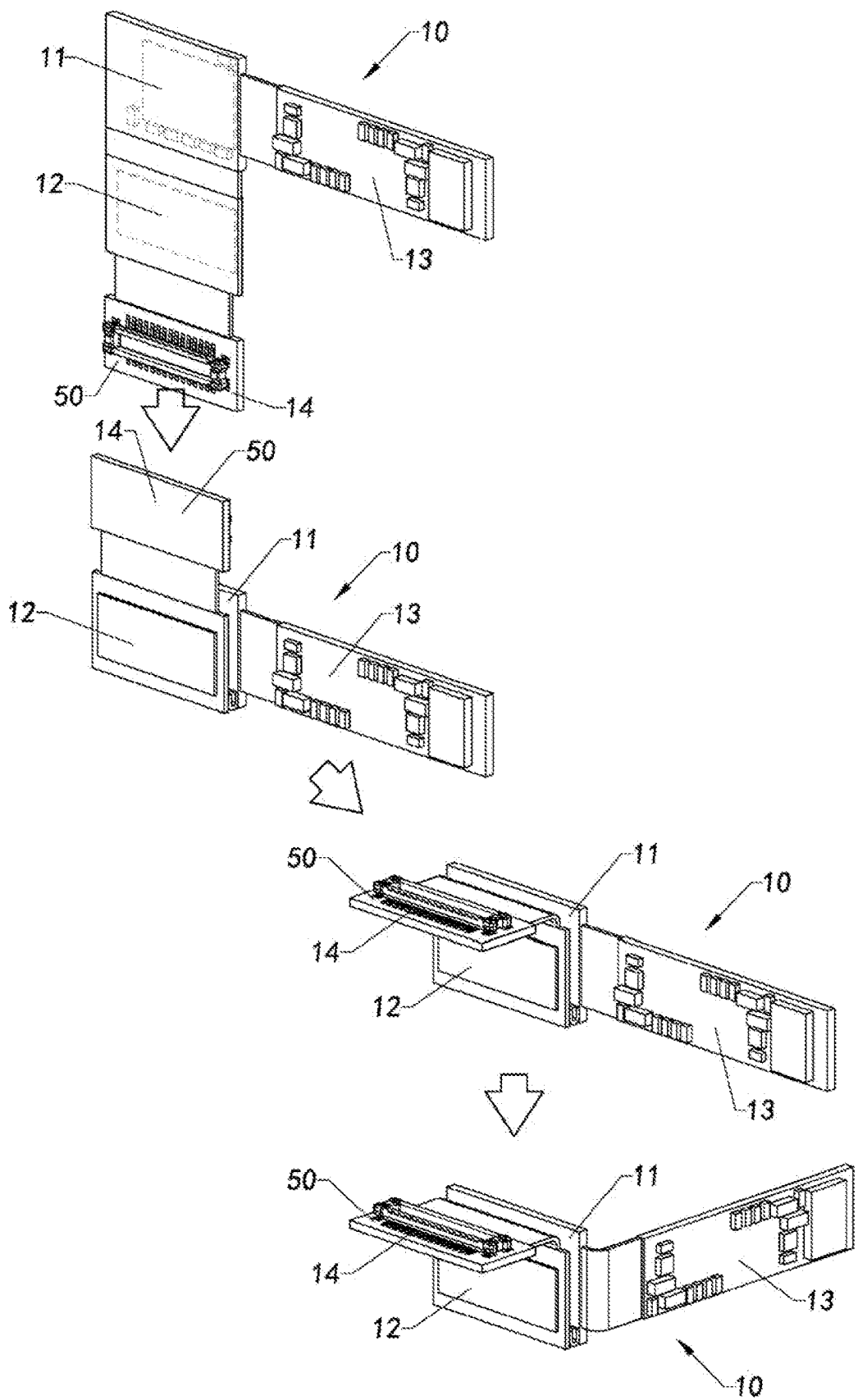
FIG. 6 is a schematic diagram of an assembling process of a circuit board according to a preferred embodiment of the present invention.

Referring to FIG. 6, it shows a schematic diagram of another assembling process of the circuit board 10 according to another preferred embodiment of the present invention, and reference may also be made to FIG. 8.

The circuit board 10 may be mounted with the connecting strap 50, wherein the connecting strap 50 is used to connect another device, such as the electronic device, or other camera module installed in the electronic device.

The photosensitive chip 40 can be mounted on the circuit board 10, and then the circuit board 10 with the photosensitive chip 40 can be assembled on the lenses holder 30 of the periscope camera module 1000, for example by mounting, so that the periscope lenses assembly 20 of the periscope camera module 1000 is held in the photosensitive path of the photosensitive chip 40 through the lenses holder 30.

In this way, the circuit board 10 is positioned on the lenses holder 30, so that no additional molding die is needed to position the chip connection portion 11.

Then, the bending portion 12 is inverted toward the rear side of the chip connection portion 11, preferably, a part of the flexible circuit board layer 10A inverted between the bending portion 12 and the chip connection portion 11 does not protrude from the second part of rigid circuit board layer 10B" and the first part of rigid circuit board layer 10B' of the bending portion 12.

Then, the connecting strap connection portion 14 is inverted to an outward position for connecting to other electronic devices.

Finally, the lenses assembly connection portion 13 is assembled to the periscope lenses assembly 20 of the periscope camera module 1000. Particularly, the lenses assembly connection portion 13 is inverted toward the front side of the flexible circuit board layer 10A, and then the periscope lenses assembly 20 is fixed to a corresponding position of the periscope lenses assembly 20.

The circuit board 10 provided in this embodiment only needs to be inverted three times to complete the assembly, and at the same time the height size of the entire circuit board 10 is reduced, so as to facilitate to reduce the height size of the entire periscope camera module 1000.

Figure 7:
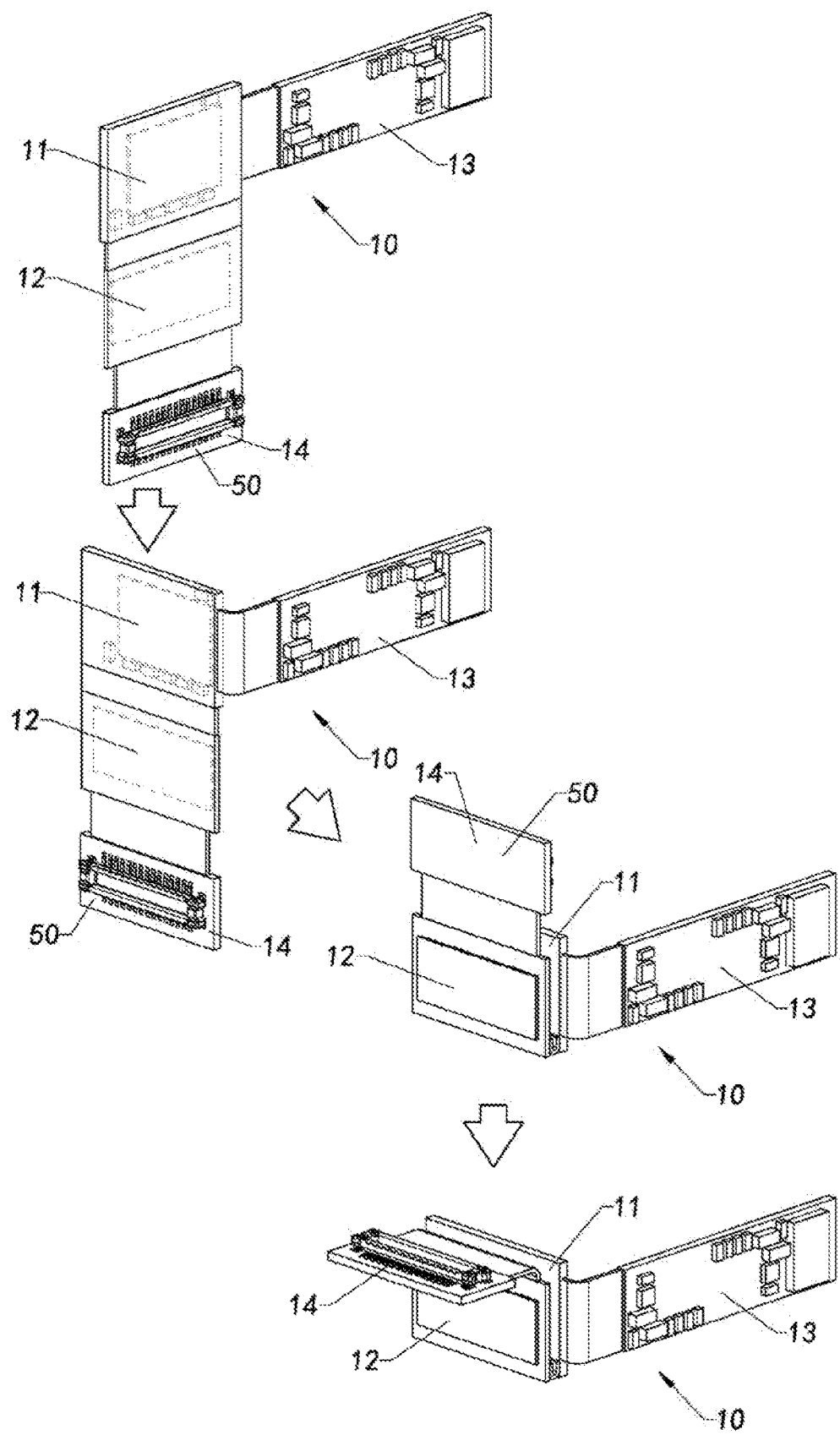
FIG. 7 is a schematic diagram of an assembling process of a circuit board according to a preferred embodiment of the present invention.

Referring to FIG. 7, it shows a schematic diagram of another assembling process of the circuit board 10 according to another preferred embodiment of the present invention, and reference may also be made to FIG. 8.

The circuit board 10 may be mounted with the connecting strap 50, wherein the connecting strap 50 is used to connect another device, such as the electronic device, or another camera module installed in the electronic device.

The circuit board 10 may be mounted with the photosensitive chip 40.

In this example, firstly the lenses assembly connection portion 13 is assembled to the periscope lenses assembly 20 of the periscope camera module 1000.

Then, the chip connection portion 11 is assembled to the lenses holder 30, so that the periscope lenses assembly 20 is held in the photosensitive path of the photosensitive chip 40. Particularly, the chip connection portion 11 is inverted toward the front side of the lenses assembly connection portion 13, so that the chip connection portion 11 is assembled to the lenses holder 30, for example, in the way of mounting.

Then, the bending portion 12 inverted toward the rear side of the chip connection portion 11, preferably a part pf the flexible circuit board layer 10A inverted between the bending portion 12 and the chip connection portion 11 does not protrude from the second part of rigid circuit board layer 10B" and the first part of rigid circuit board layer 10B' of the bending portion 12.

Finally, the connecting strap connection portion 14 is inverted to an outward position for connecting to other electronic devices.

The circuit board 10 provided in this embodiment only needs to be inverted three times to complete the assembly, and at the same time the height size of the entire circuit board 10 is reduced, so as to facilitate to reduce the height size of the entire periscope camera module 1000.

FIG. 8 shows the periscope camera module 1000 according to a preferred embodiment of the present invention. The height size of the periscope camera module 1000 to which the circuit board 10 is applied can be reduced, and the assembling process can be simplified, and the manufacturing cost of the circuit board 10 itself can also be reduced. Further, the periscope lenses assembly 20 of the periscope device module has two side surfaces, a top surface and two bottom surfaces, wherein the photosensitive chip 40 is located on one of the bottom surfaces, and the top surface is a surface facing the object being photographed. In this example, the lenses assembly connection portion 13 of the circuit board 10 is located on a left side, and the bending portion 12 is inverted from bottom to top. In other examples of the present invention, the lenses assembly connection portion 13 of the circuit board 10 may be located on a right side. In other examples of the present invention, the bending portion 12 of the circuit board 10 may be inverted from top to bottom.

Figure 9:
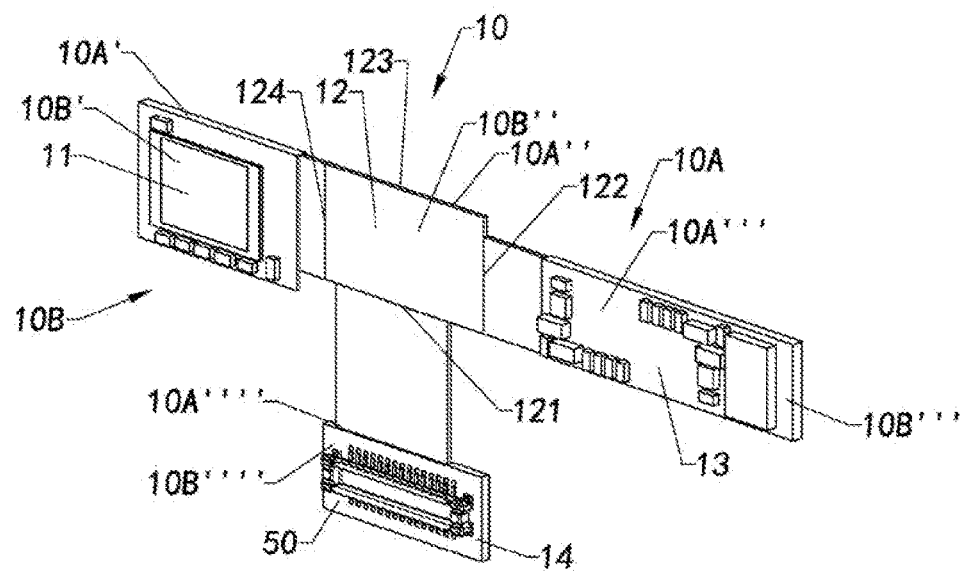
FIG. 9 is a schematic diagram of a circuit board according to a preferred embodiment of the present invention.

FIG. 9 shows a modified embodiment of the circuit board 10 according to the present invention, wherein the circuit board 10 includes a flexible circuit board layer 10A and a rigid circuit board layer 10B, wherein the rigid circuit board layer 10B is arranged on a front side of the flexible circuit board layer 10A.

The circuit board 10 further includes a chip connection portion 11, a bending portion 12, a lenses assembly connection portion 13 and a connecting strap connection portion 14; wherein the chip connection portion 11 is used to connect to a photosensitive chip, the bending portion 12 is connected to the chip connection portion 11 in an invertible manner, the lenses assembly connection portion 13 is adapted to be connected to a periscope lenses assembly of a periscope camera module, the connecting strap connection portion 14 is adapted to be connected to a connecting strap, and wherein the lenses assembly connection portion 13 is connected to the chip connection portion 11 in an invertible manner, and the connecting strap connection portion 14 is connected to the chip connection portion 11 in an invertible manner.

More particularly, the bending portion 12 is located between the chip connection portion 11 and the lenses assembly connection portion 13. The two sides of the bending portion 12 are respectively connected with the chip connection portion 11 and the lenses assembly connection portion 13, and the connecting strap connection portion 14 is connected to one side of the bending portion 12, so that the circuit board 10 is a T-shaped structure.

The bending portion 12 has a first edge 121, a second edge 122, a third edge 123, and a fourth edge 124, wherein the first edge 121 is respectively connected to the second edge 122 and the fourth edge 124, the second edge 122 is respectively connected to the first edge 121 and the third edge 123, and the third edge 123 is respectively connected to the second edge 122 and the fourth edge 124. The first edge 121 and the third edge 123 are arranged opposite to each other, and the second edge 122 and the fourth edge 124 are arranged opposite to each other.

The chip connection portion 11 extends to the fourth edge 124 of the bending portion 12, the connecting strap connection portion 14 extends to the first edge 121 of the bending portion 12, and the lenses assembly connection portion 13 extends to the second edge 122 of the bending portion 12. Preferably, the chip connection portion 11, the bending portion 12, and the lenses assembly connection portion 13 are located on a same straight line. Further, the connecting strap connection portion 14 is perpendicular to the straight line where the chip connection portion 11, the bending portion 12 and the lenses assembly connection portion 13 are located.

Further, the flexible circuit board layer 10A includes a first part of flexible circuit board layer 10A', a second part of flexible circuit board layer 10A", a third part of flexible circuit board layer 10A''', and a fourth part of flexible circuit board layer 10A''''; wherein the first part of flexible circuit board layer 10A' and the third part of flexible circuit board layer 10A''' are respectively connected to the second part of flexible circuit board Layer 10A", and wherein the first part of flexible circuit board layer 10A', the second part of flexible circuit board layer 10A" and the third part of flexible circuit board layer 10A''' are located on a same straight line, and the fourth part of flexible circuit board layer 10A'''' is formed by extending outward from the second part of flexible circuit board layer 10A".

The rigid circuit board layer 10B includes a first part of rigid circuit board layer 10B', a second part of rigid circuit board layer 10B", a third part of rigid circuit board layer 10B''', and a fourth part of rigid circuit board layer 10B''''; wherein the first part of rigid circuit board layer 10B', the second part of rigid circuit board layer 10B", the third part of rigid circuit board layer 10B''', and the fourth part of rigid circuit board layer 10B'''' is arranged at interval on the flexible circuit board layer 10A.

The chip connection portion 11 includes the first part of rigid circuit board layer 10B' and the part of the first part of flexible circuit board layer 10A' of the flexible circuit board layer 10A overlapping the first part of rigid circuit board layer 10B', the bending portion 12 includes the second part of rigid circuit board layer 10B" and the part of the second part of flexible circuit board layer 10A" of the flexible circuit board layer 10A overlapping the second part of rigid circuit board layer 10B", the lenses assembly connection portion 13 includes the third part of rigid circuit board layer 10B''' and the part of the third part of flexible circuit board layer 10A''' of the flexible circuit board layer 10A overlapping the third part of rigid circuit board layer 10B''', and the connecting strap connection portion 14 includes the fourth part of rigid circuit board layer 10B'''' and the part of the fourth part of flexible circuit board layer 10A'''' of the flexible circuit board layer 10A overlapping the fourth part of rigid circuit board layer 10B''''.

It can be understood that, in other examples of the present invention, the connecting strap connection portion 14 may include at least part of the flexible circuit board layer 10A.

Figure 10:
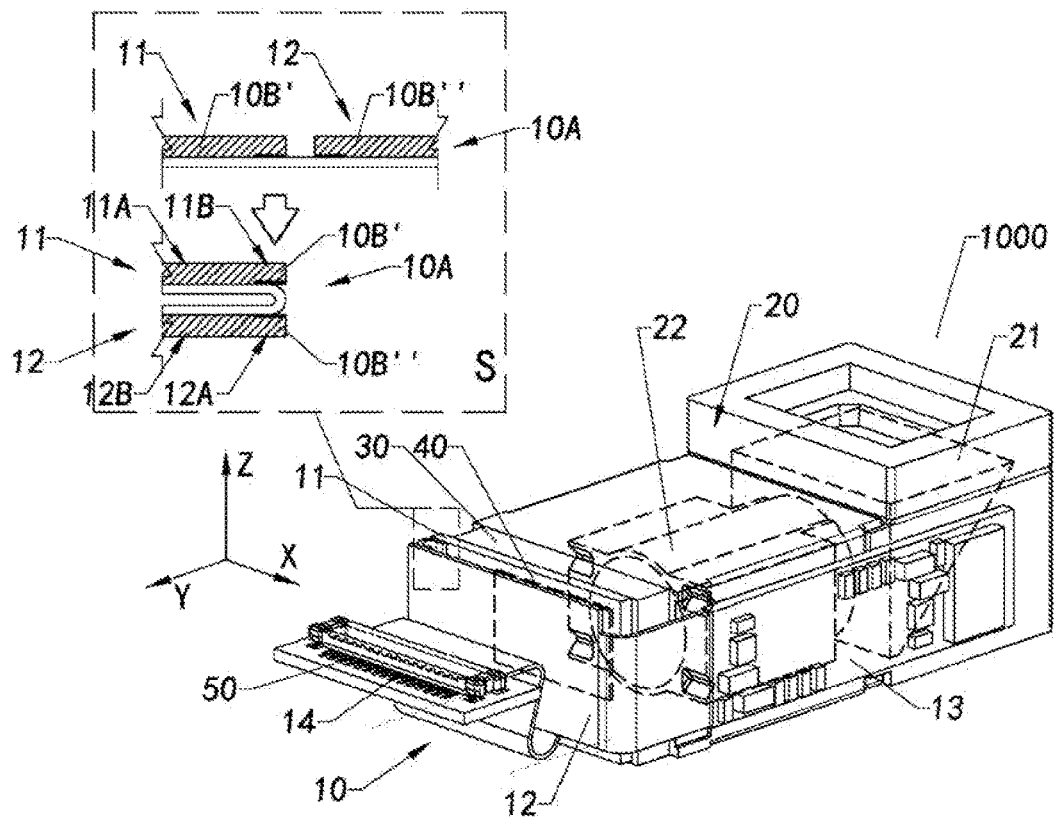
FIG. 10 is a schematic diagram of a periscope camera module according to a preferred embodiment of the present invention.

Further referring to FIG. 10, the circuit board 10 is mounted on a lenses holder 30 of the periscope camera module 1000. The photosensitive chip 40 is mounted on the front side of the chip connection portion 11 of the circuit board 10, i.e., a side where the rigid circuit board layer 10B is located.

The bending portion 12 is inverted to the rear side of the chip connection portion 11, and the lenses assembly connection portion 13 is inverted forward to be connected to the periscope lenses assembly 20 of the periscope camera module 1000, the connecting strap connection portion 14 connected to the bending portion 12 is inverted outward to the connecting strap connection portion 14, and is connected to a connecting strap 50, so as to adapt to be connected to an electronic device body in the subsequent installation process.

It can be understood that, the rear side here refers to a side opposite to the side where the photosensitive chip 40 is mounted.

When the bending portion 12 is inverted to the rear side of the chip connection portion 11, the size of the part of the flexible circuit board layer 10A located between the bending portion 12 and the chip connection portion 11 can be reduced. Particularly, when the bending portion 12 is inverted, the second part of rigid circuit board layer 10B" of the bending portion 12 and the first part of rigid circuit board layers 10B' of the chip connection portion 11 are respectively located on the outside, so that the part of the second part of flexible circuit board overlapping the second part of rigid circuit board layer 10B" and the part of the first part of flexible circuit board layer 10A' overlapping the first part of rigid circuit board layer 10B' does not need to avoid the second part of rigid circuit board layer 10B" and the first part of rigid circuit board layer 10B', thus a part of the flexible circuit board layer 10A protruding from the first part of rigid circuit board layer 10B' or protruding from the second part of rigid circuit board layer 10B" can be reduced.

Referring to the S position of FIG. 10, further, the part of the second part of flexible circuit board layer 10A" located at one end of the bending portion 12 that is close to the chip connection portion 11 is detachably connected to the second part of rigid circuit board layer 10B", so as to facilitate to reduce the length of the flexible circuit board layer 10A located between the bending portion 12 and the chip connection portion 11, thereby facilitating the reduction of the area size of the circuit board 10 after assembling.

Further, the part of the first part of flexible circuit board layer 10A' located at one end of the chip connection portion 11 that is close to the bending portion 12 is detachably connected to the first part of rigid circuit board layer 10B', so as to facilitate to reduce the length of the flexible circuit board layer 10A located between the bending portion 12 and the chip connection portion 11, thereby facilitating the reduction of the size in area of the circuit board 10 after assembling.

More particularly, the bending portion 12 includes a first part of bending portion 12A and a second part of bending portion 12B, wherein the first part of bending portion 12A extends to the second part of bending portion 12B, and the first part of bending portion 12A is close to the chip connection portion 11 relative to the second part of bending portion 12.

The chip connection portion 11 includes a first part of chip connection portion 11A and a second part of chip connection portion 11B, wherein the first part of chip connection portion 11A extends to the second part of chip connection portion 11B, and the second part of chip connection portion 11B is close to the bending portion 12 relative to the first part of chip connection portion 11A.

The first part of bending portion 12A includes at least part of the flexible circuit board layer 10A and at least part of the rigid circuit board layer 10B. More particularly, the first part of bending portion 12A includes at least part of the second part of rigid circuit board layer 10B" and the part of the second part of flexible circuit board layer 10A" overlapping the second part of rigid circuit board layer 10B", the second part of bending portion 12B includes at least part of the second part of rigid circuit board layer 10B" and the part of the second part of flexible circuit board layer 10A" overlapping the second rigid circuit board layer 10B", wherein a part of the second part of rigid circuit board layer 10B" of the first part of bending portion 12A is detachably connected to the part of the second part of flexible circuit board layer 10A".

The first part of chip connection portion 11A includes at least part of the flexible circuit board layer 10A and at least part of the rigid circuit board layer 10B. More particularly, the first part of chip connection portion 11A includes at least part of the first part of rigid circuit board layer 10B' and the part of the first part of flexible circuit board layer 10A' overlapping the first part of rigid circuit board layer 10B', the second part of chip connection portion 11B includes at least the first part of rigid circuit board layer 10B' and the part of the first part of flexible circuit board layer 10A' overlapping the first part of rigid circuit board layer 10B', wherein the part of the first part of rigid circuit board layer 10B' of the second part of chip connection portion 11B is detachably connected to the first part of flexible circuit board layer 10A'.

Furthermore, when the bending portion 12 is inverted relative to the chip connection portion 11, a part of the flexible circuit board layer 10A of the adjacent the second part of chip connection portion 11B and the first part of bending portion 12A can be separated from the corresponding part of the rigid circuit board layer 10B, so as to facilitate to reduce the size of the circuit board 10.

Figure 11:
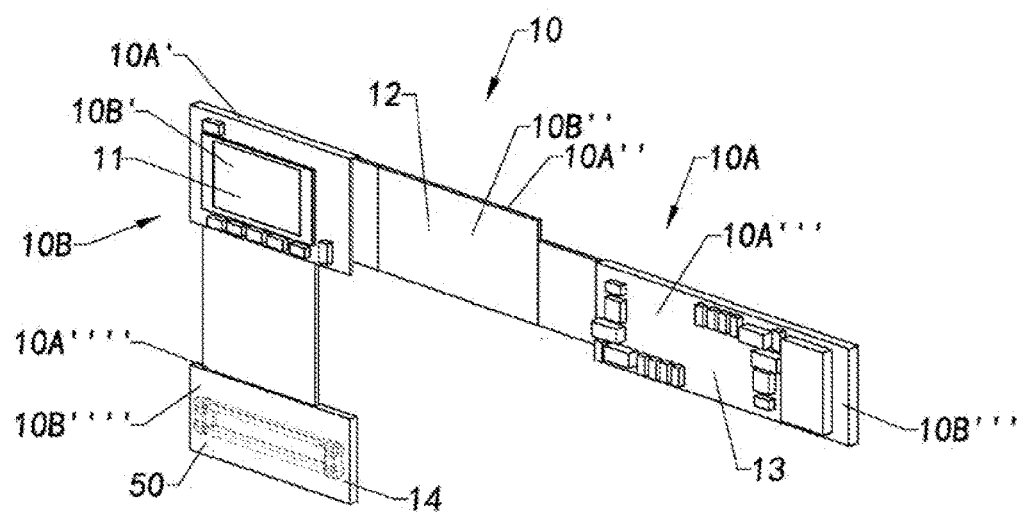
FIG. 11 is a schematic diagram of a circuit board according to a preferred embodiment of the present invention.

Referring to FIG. 11, it shows a modified embodiment of the circuit board 10 according to the above preferred embodiment of the present invention.

The circuit board 10 includes a flexible circuit board layer 10A and a rigid circuit board layer 10B, wherein the rigid circuit board layer 10B is arranged on a front side of the flexible circuit board layer 10A.

The circuit board 10 further includes a chip connection portion 11, a bending portion 12, a lenses assembly connection portion 13, and a connecting strap connection portion 14, wherein the chip connection portion 11 is used to connect to a photosensitive chip, wherein the bending portion 12 is connected to the chip connection portion 11 in an invertible manner, wherein the lenses assembly connection portion 13 is adapted to be connected to a periscope lenses assembly of a periscope camera module, wherein the connecting strap connection portion is adapted to be connected to a connecting strap, wherein the lenses assembly connection portion 13 is connected to the chip connection portion 11 in an invertible manner, and the connecting strap connection portion 14 is connected to the chip connection portion 11 in an invertible manner.

More particularly, the bending portion 12 is located between the chip connection portion 11 and the lenses assembly connection portion 13. The two sides of the bending portion 12 are respectively connected to the chip connection portion 11 and the lenses assembly connection portion 13, and the connecting strap connection portion 14 is connected to one side of the chip connection portion 11, so that the circuit board 10 is an L-shaped structure.

The bending portion 12 has a first edge 121, a second edge 122, a third edge 123, and a fourth edge 124, wherein the first edge 121 is respectively connected to the second edge 122 and the fourth edge 124, wherein the second edge 122 is respectively connected to the first edge 121 and the third edge 123, and the third edge 123 is respectively connected to the second edge 122 and the fourth edge 124. The first edge 121 and the third edge 123 are arranged opposite to each other, and the second edge 122 and the fourth edge 124 are arranged opposite to each other.

The chip connection portion 11 extends to the fourth edge 124 of the bending portion 12, the connecting strap connection portion 14 extends to one side of the chip connection portion 11, and the lenses assembly connection portion 13 extends to the second edge 122 of the bending portion 12. Preferably, the chip connection portion 11, the bending portion 12, and the lenses assembly connection portion 13 are located on a same straight line. Further, the connecting strap connection portion 14 is perpendicular to the straight line where the chip connection portion 11, the bending portion 12 and the lenses assembly connection portion 13 are located.

Further, the flexible circuit board layer 10A includes a first part of flexible circuit board layer 10A', a second part of flexible circuit board layer 10A", a third part of flexible circuit board layer 10A''', and a fourth part of flexible circuit board layer 10A''''; wherein the first part of flexible circuit board layer 10A' and the third part of flexible circuit board layer 10A''' are respectively connected to the second part of flexible circuit board layer 10A"; wherein the first part of flexible circuit board layer 10A', the second part of flexible circuit board layer 10A", and the third part of flexible circuit board layer 10A''' are located on a same straight line, and the fourth part of flexible circuit board layer 10A'''' is formed by extending outward from the first part of flexible circuit board layer 10A'.

The rigid circuit board layer 10B includes a first part of rigid circuit board layer 10B', a second part of rigid circuit board layer 10B", a third part of rigid circuit board layer 10B''', and a fourth part of rigid circuit board layer 10B''''; wherein the first part of rigid circuit board layer 10B', the second part of rigid circuit board layer 10B", the third part of rigid circuit board layer 10B''' and the fourth part of rigid circuit board layer 10B'''' is arranged at interval on the flexible circuit board layer 10A.

The chip connection portion 11 includes the first part of rigid circuit board layer 10B' and the part of the first part of flexible circuit board layer 10A' of the flexible circuit board layer 10A overlapping the first part of rigid circuit board layer 10B', the bending portion 12 includes the second part of rigid circuit board layer 10B" and the part of the second part of flexible circuit board layer 10A" of the flexible circuit board layer 10A overlapping the second part of rigid circuit board layer 10B", the lenses assembly connection portion 13 includes the third part of rigid circuit board layer 10B''' and the part of the third part of flexible circuit board layer 10A''' of the flexible circuit board layer 10A overlapping the third part of rigid circuit board layer 10B''', and the connecting strap connection portion 14 includes the fourth portion of the rigid circuit board layer 10B'''' and the part of the fourth part of flexible circuit board layer 10A'''' of the flexible circuit board layer 10A overlapping the fourth part of rigid circuit board layer 10B''''.

It can be understood that, in other examples of the present invention, the connecting strap connection portion 14 may include at least part of the flexible circuit board layer 10A.

Figure 12:
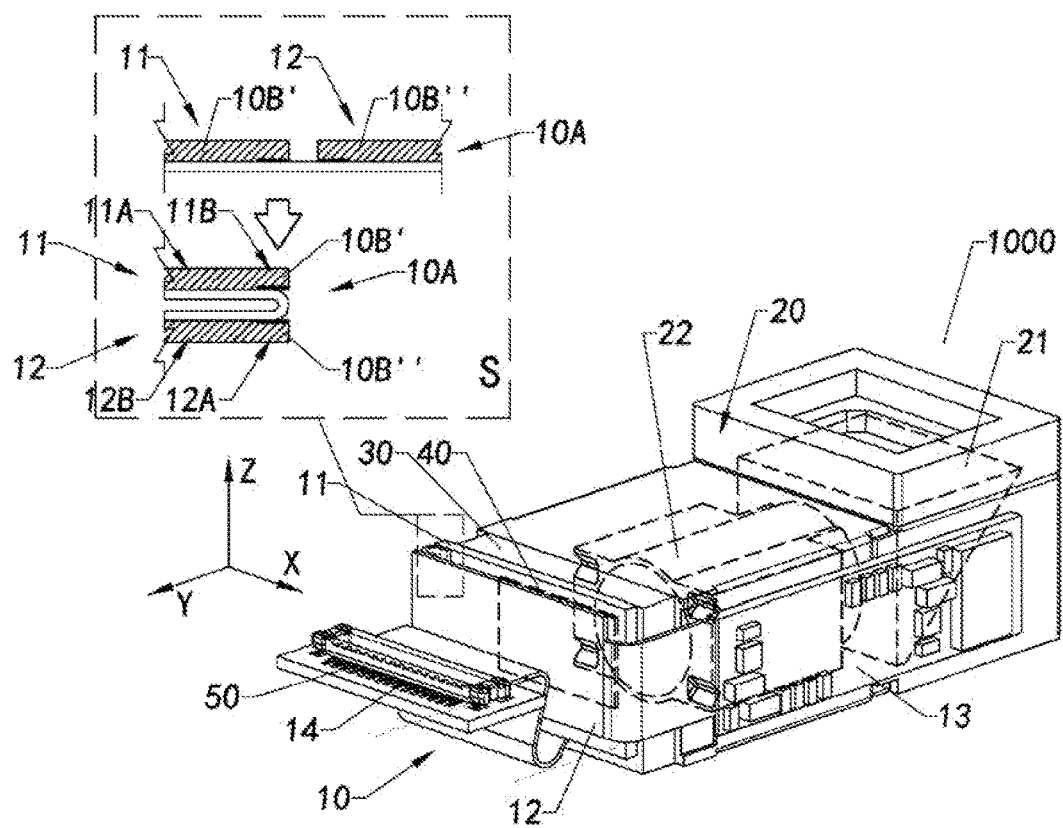
FIG. 12 is a schematic diagram of a periscope camera module according to a preferred embodiment of the present invention.

With further reference to FIG. 12, the circuit board 10 is mounted on a lenses holder 30 of the periscope camera module 1000. The photosensitive chip 40 is mounted on the front side of the chip connection portion 11 of the circuit board 10, i.e., a side where the rigid circuit board layer 10B is located.

The bending portion 12 is inverted to the rear side of the chip connection portion 11, and the lenses assembly connection portion 13 is inverted forward to be connected to a periscope lenses assembly 20 of the periscope camera module 1000, the connecting strap connection portion 14 connected to the bending portion 12 is inverted so that the connecting strap connection portion 14 faces outward and is connected to a connecting strap 50, so as to adapt to be connected to an electronic device body in the subsequent installation process.

It can be understood that, the rear side here refers to a side opposite to the side where the photosensitive chip 40 is mounted.

When the bending portion 12 is inverted to the rear side of the chip connection portion 11, the size of a part of the flexible circuit board layer 10A located between the bending portion 12 and the chip connection portion 11 can be reduced. Particularly, when the bending portion 12 is inverted, the second part of rigid circuit board layer 10B" of the bending portion 12 and the first part of rigid circuit board layer 10B' of the chip connection portion 11 are respectively located on the outside, so that the part of the second part of flexible circuit board layer 10A" overlapping the second part of rigid circuit board layer 10B" and the part of the first part of flexible circuit board layer 10A' overlapping the first part of rigid circuit board layer 10B' do not need to avoid the second part of rigid circuit board layer 10B" and the first part of rigid circuit board layer 10B', and thus a part of the flexible circuit board layer 10A protruding from the first part of rigid circuit board layer 10B' or protruding from the second part of rigid circuit board layer 10B" can be reduced.

Referring to the position S of FIG. 12, further, the part of the second part of flexible circuit board layer 10A" located at one end of the bending portion 12 that is close to the chip connection portion 11 is detachably connected to the second part of rigid circuit board layer 10B", so as to facilitate to reduce the length of the flexible circuit board layer 10A located between the bending portion 12 and the chip connection portion 11, thereby facilitating the reduction of the size in area of the circuit board 10 after assembling.

Further, the part of the first part of flexible circuit board layer 10A' located at one end of the chip connection portion 11 that is close to the bending portion 12 is detachably connected to the first part of rigid circuit board layer 10B', so as to facilitate to reduce the length of the flexible circuit board layer 10A located between the bending portion 12 and the chip connection portion 11, thereby facilitating the reduction of the size in area of the circuit board 10 after assembling.

More particularly, the bending portion 12 includes a first part of bending portion 12A and a second part of bending portion 12B, wherein the first part of bending portion 12A extends to the second part of bending portion 12B, and the first part of bending portion 12A is close to the chip connection portion 11 relative to the second part of bending portion 12B.

The chip connection portion 11 includes a first part of chip connection portion 11A and a second part of chip connection portion 11B, wherein the first part of chip connection portion 11A extends to the second part of chip connection portion 11B, and the second part of chip connection portion 11B is close to the bending portion 12 relative to the first part of chip connection portion 11A.

The first part of bending portion 12A includes at least part of the flexible circuit board layer 10A and at least part of the rigid circuit board layer 10B. More particularly, the first part of bending portion 12A includes at least part of the second part of rigid circuit board layer 10B" and the part of the second part of flexible circuit board layer 10A" overlapping the second part of rigid circuit board layer 10B", the second part of bending portion 12B includes at least part of the second part of rigid circuit board layer 10B" and the part of the second part of flexible circuit board layer 10A" overlapping the second rigid circuit board layer 10B", wherein a part of the second part of rigid circuit board layer 10B" of the first part of bending portion 12A is detachably connected to a part of the second part of flexible circuit board layer 10A".

The first part of chip connection portion 11A includes at least part of the flexible circuit board layer 10A and at least part of the rigid circuit board layer 10B. More particularly, the first part of chip connection portion 11A includes at least part of the first part of rigid circuit board layer 10B' and the part of the first part of flexible circuit board layer 10A' overlapping the first part of rigid circuit board layer 10B', the second part of chip connection portion 11B includes at least part of the first part of rigid circuit board layer 10B' and the part of the first part of flexible circuit board layer 10A' overlapping the first part of rigid circuit board layer 10B', wherein a part of the first part of rigid circuit board layer 10B' of the second part of chip connection portion 11B is detachably connected to a part of the first part of flexible circuit board layer 10A'.

Furthermore, when the bending portion 12 is inverted relative to the chip connection portion 11, a part of the flexible circuit board layer 10A of the adjacent second part of chip connection portion 11B and the first part of bending portion 12A can be separated from the corresponding part of the rigid circuit board layer 10B, so as to facilitate to reduce the size of the circuit board 10.

Further, when the connecting strap connection portion 14 is inverted, a part of the flexible circuit board layer 10A located between the connecting strap connection portion 14 and the chip connection portion 11 does not protrude from the chip connection portion 11. That is to say, the lowest point of the circuit board 10 in the height direction can be determined by the size of the chip connection portion 11, and the connecting strap connection portion 14 does not affect it.

After the circuit board 10 is installed, the bending portion 12 and the chip connection portion 11 are arranged face-to-face, and the connecting strap connection portion 14 is turned over to the rear side of the bending portion 12. The sizes of both the bending portion 12 and the connecting strap connection portion 14 in the height direction can be smaller than that of the chip connection portion 11, so as to facilitate to reduce the size, especially the height size, of the circuit board 10 after installation.

FIG. 13 shows an electronic device 1 according to a preferred embodiment of the present invention, wherein the electronic device 1 includes the periscope camera module 1000 and an electronic device body 2000, wherein the periscope camera module 1000 is installed in the electronic device body 2000. Optionally, the connecting strap connection portion 14 of the circuit board 10 of the periscope camera module 1000 is conductively connected to the electronic device body 2000. Optionally, the connecting strap connection portion 14 of the circuit board 10 of the periscope camera module 1000 is inserted into the electronic device body 2000. A connecting strap 50 is installed on the connecting strap connection portion 14, so that the periscope camera module 1000 may be electrically connected to the electronic device body 2000 through the connecting strap 50.

Those skilled in the art should understand that, the above description and the embodiments of the present invention shown in the drawings are only examples and do not limit the present invention. The purpose of the present invention has been completely and effectively achieved. The functions and structural principles of the present invention have been shown and explained in the embodiments. Without departing from the principles, the embodiments of the present invention may have any deformation or modification.

The invention claimed is:

1. A circuit board, characterized by comprising:
   a rigid circuit board layer, wherein the rigid circuit board layer includes a first part of rigid circuit board layer;
   a flexible circuit board layer, wherein the rigid circuit board layer is arranged on a front side of the flexible circuit board layer, and the flexible circuit board layer includes a first part of flexible circuit board layer and a second part of flexible circuit board layer, and the first part of flexible circuit board layer extends to the second part of flexible circuit board layer;
   a chip connection portion, wherein the chip connection portion includes the first part of rigid circuit board layer and a part of the first part of flexible circuit board layer overlapping the first part of rigid circuit board layer; and
   a bending portion, wherein the bending portion includes at least part of the second part of flexible circuit board layer, and the bending portion is connected to the chip connection portion in an invertible manner.

2. The circuit board according to claim 1, wherein the rigid circuit board layer further includes a second part of rigid circuit board layer, wherein the bending portion includes the second part of rigid circuit board layer and a part of the second part of flexible circuit board layer overlapping the second part of rigid circuit board layer.

3. The circuit board according to claim 2, wherein a part of the first part of flexible circuit board layer of the chip connection portion located close to one end of the bending portion is detachably connected to the first part of rigid circuit board.

4. The circuit board according to claim 2, wherein a part of the second part of flexible circuit board layer of the bending portion located close to one end of the chip connection portion is detachably connected to the second part of rigid circuit board layer.

5. The circuit board according to claim 4, wherein a part of the first part of flexible circuit board layer of the chip connection portion located close to one end of the bending portion is detachably connected to the first part of rigid circuit board.

6. The circuit board according to claim 2, wherein after the bending portion is inverted to a rear side of the chip connection portion, the bent part of the flexible circuit board layer located between the bending portion and the chip connection portion does not protrude from the rigid circuit board layer.

7. The circuit board according to claim 2, wherein the circuit board further includes a reinforcing member, wherein the reinforcing member is arranged on the bending portion to fix the second part of flexible circuit board layer of the bending portion located at one end away from the chip connection portion on the second part of rigid circuit board layer.

8. The circuit board according to claim 1, wherein a part of the first part of flexible circuit board layer of the chip connection portion located close to one end of the bending portion is detachably connected to the first part of rigid circuit board.

9. The circuit board according to claim 1, wherein after the bending portion is inverted to a rear side of the chip connection portion, the bent part of the flexible circuit board layer located between the bending portion and the chip connection portion does not protrude from the rigid circuit board layer.

10. The circuit board according to claim 1, wherein the flexible circuit board layer further includes a third part of flexible circuit board layer, and the third part of flexible circuit board layer is connected to the first part of flexible circuit board layer through the second part of flexible circuit board layer, and the circuit board further includes a lenses assembly connection portion, and the rigid circuit board layer further includes a third part of rigid circuit board layer, wherein the lenses assembly connection portion includes the third part of rigid circuit board layer and a part of the third part of flexible circuit board layer overlapping the third part of rigid circuit board layer, and the chip connection portion, the bending portion and the lenses assembly connection portion are located on a same straight line, and the lenses assembly connection portion is connected to the bending portion in an invertible manner.

11. The circuit board according to claim 10, wherein the flexible circuit board layer further includes a fourth part of flexible circuit board layer, and the circuit board further includes a connecting strap connection portion, wherein the connecting strap connection portion is adapted to connect a connecting strap, and the connecting strap connection portion includes at least part of the fourth part of flexible circuit board layer, and the fourth part of flexible circuit board layer extends to the chip connection portion, and an extending direction of the fourth part of flexible circuit board layer is perpendicular to an extending direction from the chip connection portion to the bending portion, and the connecting strap connection portion is connected to the chip connection portion in an invertible manner.

12. The circuit board according to claim 1, wherein the flexible circuit board layer further includes a third part of flexible circuit board layer, and the first part of flexible circuit board layer has a first side and a second side, and the first side and the second side are adjacent, and the second part of flexible circuit board layer and the third part of flexible circuit board layer respectively extend to the first side and the second side, wherein the circuit board further includes a lenses assembly connection portion, and the rigid circuit board layer further includes a third part of rigid circuit board layer, wherein the lenses assembly connection portion includes the third part of rigid circuit board layer and a part of the third part of flexible circuit board layer overlapping the third part of rigid circuit board layer, and the bending portion and the lenses assembly connection portion are respectively located on two adjacent sides of the chip connection portion, and the lenses assembly connection portion is connected to the chip connection portion in an invertible manner.

13. The circuit board according to claim 12, wherein the flexible circuit board layer further includes a fourth part of flexible circuit board layer, and the circuit board further includes a connecting strap connection portion, wherein the connecting strap connection portion is adapted to connect a connecting strap, and the connecting strap connection portion includes at least part of the fourth part of flexible circuit board layer, and the fourth part of flexible circuit board layer extends to the bending portion, and an extending direction of the fourth part of flexible circuit board layer is perpendicular to an extending direction from the chip connection portion to the bending portion.

14. The circuit board according to claim 1, wherein the flexible circuit board layer further includes a fourth part of flexible circuit board layer, and the circuit board further includes a connecting strap connection portion, wherein the connecting strap connection portion is adapted to connect a connecting strap, and the connecting strap connection portion includes at least part of the fourth part of flexible circuit board layer, and the fourth part of flexible circuit board layer extends to the chip connection portion, and an extending direction of the fourth part of flexible circuit board layer is perpendicular to an extending direction from the chip connection portion to the bending portion, and the connecting strap connection portion is connected to the chip connection portion in an invertible manner.

15. The circuit board according to claim 1, wherein the flexible circuit board layer further includes a fourth part of flexible circuit board layer, and the circuit board further includes a connecting strap connection portion, wherein the connecting strap connection portion is adapted to connect a connecting strap, and the connecting strap connection portion includes at least part of the fourth part of flexible circuit board layer, and the fourth part of flexible circuit board layer extends to the bending portion, and an extending direction of the fourth part of flexible circuit board layer is perpendicular to an extending direction from the chip connection portion to the bending portion.

16. A circuit board jointed panel, characterized by comprising: a plurality of the circuit boards according to claim 1, wherein the circuit board jointed panel includes a flexible circuit board layer and a plurality of rigid circuit board layers, and one of the rigid circuit board layers and corresponding part of the flexible circuit board layer form a single circuit board.

17. A periscope camera module, characterized by comprising:
  a periscope lenses assembly; and
  a photosensitive assembly, wherein the photosensitive assembly includes a lenses holder, a photosensitive chip and a circuit board, and the periscope lenses assembly is held in a photosensitive path of the photosensitive chip through the lenses holder, and the photosensitive chip is conductively connected to the circuit board, wherein the circuit board includes:
    a rigid circuit board layer, wherein the rigid circuit board layer includes a first part of rigid circuit board layer;
    a flexible circuit board layer, wherein the flexible circuit board layer includes a first part of flexible circuit board layer and a second part of flexible circuit board layer;
    a chip connection portion, wherein the chip connection portion includes the first part of rigid circuit board layer and a part of the first part of flexible circuit board layer overlapping the first part of rigid circuit board layer; and
    a bending portion, wherein the bending portion includes at least part of the second part of flexible circuit board layer, wherein the bending portion is connected to the chip connection portion in an invertible manner, and the photosensitive chip connection portion is mounted on a front side of the chip connection portion, and the bending portion is inverted to a rear side of the photosensitive chip connection portion.

18. The periscope camera module according to claim 17, wherein the rigid circuit board layer further includes a second part of rigid circuit board layer, and the bending portion includes the second part of rigid circuit board and a part of the second part of flexible circuit board layer overlapping the second part of rigid circuit board layer.

19. The circuit board according to claim 18, wherein a part of the first part of flexible circuit board layer of the chip connection portion located close to one end of the bending portion is detachably connected to the first part of rigid circuit board layer.

20. The circuit board according to claim 17, wherein a part of the first part of flexible circuit board layer of the chip connection portion located close to one end of the bending portion is detachably connected to the first part of rigid circuit board layer.

\* \* \* \* \*